(12) United States Patent
Noda et al.

(10) Patent No.: US 7,102,954 B2
(45) Date of Patent: Sep. 5, 2006

(54) SEMICONDUCTOR INTEGRATED CIRCUIT DEVICE HAVING LOGIC CIRCUIT AND DYNAMIC RANDOM ACCESS MEMORY ON THE SAME CHIP

(75) Inventors: Hideyuki Noda, Hyogo (JP); Kazutami Arimoto, Hyogo (JP); Katsumi Dosaka, Hyogo (JP); Takeshi Fujino, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 146 days.

(21) Appl. No.: 10/714,393

(22) Filed: Nov. 17, 2003

(65) Prior Publication Data

US 2004/0136230 A1    Jul. 15, 2004

Related U.S. Application Data

(63) Continuation of application No. 09/632,333, filed on Aug. 3, 2000, now Pat. No. 6,649,984.

(30) Foreign Application Priority Data

Aug. 30, 1999    (JP) .................................. 11-243189

(51) Int. Cl.
G11C 5/14    (2006.01)
G11C 29/06    (2006.01)

(52) U.S. Cl. .................. 365/227; 365/229; 365/228; 365/208; 365/207

(58) Field of Classification Search ............... 365/226, 365/227, 228, 229, 190, 205, 207, 208
See application file for complete search history.

(56) References Cited

U.S. PATENT DOCUMENTS

| | | | |
|---|---|---|---|
| 4,471,373 A | 9/1984 | Shimizu et al. | 257/315 |
| 4,482,985 A | 11/1984 | Itoh et al. | 365/226 |
| 5,101,248 A | 3/1992 | Takebuchi | 257/314 |
| 5,256,892 A | 10/1993 | Yoshida | 257/306 |
| 5,293,336 A | 3/1994 | Ishii et al. | 365/149 |
| 5,592,434 A | 1/1997 | Iwamoto et al. | 365/233 |
| 5,610,858 A | 3/1997 | Iwahashi | 365/185.23 |
| 5,825,712 A | 10/1998 | Higashi et al. | 365/230.03 |
| 5,920,779 A * | 7/1999 | Sun et al. | 438/275 |
| 6,420,248 B1 * | 7/2002 | Liu et al. | 438/585 |
| 6,445,047 B1 * | 9/2002 | Yamada et al. | 257/391 |
| 6,649,984 B1 * | 11/2003 | Noda et al. | 257/392 |
| 2001/0010654 A1 | 8/2001 | Shau | 365/222 |

FOREIGN PATENT DOCUMENTS

| | | |
|---|---|---|
| EP | 0443603 A2 * | 8/1991 |
| JP | 08-204142 | 8/1996 |
| JP | 11-214656 A | 8/1999 |
| JP | 11-238860 | 8/1999 |

OTHER PUBLICATIONS

"A 5.3-GB/s Embedded SDRAM Core with Slight-Boost Scheme", A. Yamazaki et al., IEEE Journal of Solid-State Circuits, vol. 34, No. 5, May 1999, pp. 661-667.

* cited by examiner

Primary Examiner—Andrew Q. Tran
(74) Attorney, Agent, or Firm—McDermott Will & Emery LLP

(57) ABSTRACT

In a memory circuit, a transistor formed in the same process as that of a logic transistor is used for peripheral circuitry except for a region to be supplied with high voltage. Thus, the manufacturing process can be simplified and a logic-merged memory operating at a high speed is provided.

7 Claims, 15 Drawing Sheets

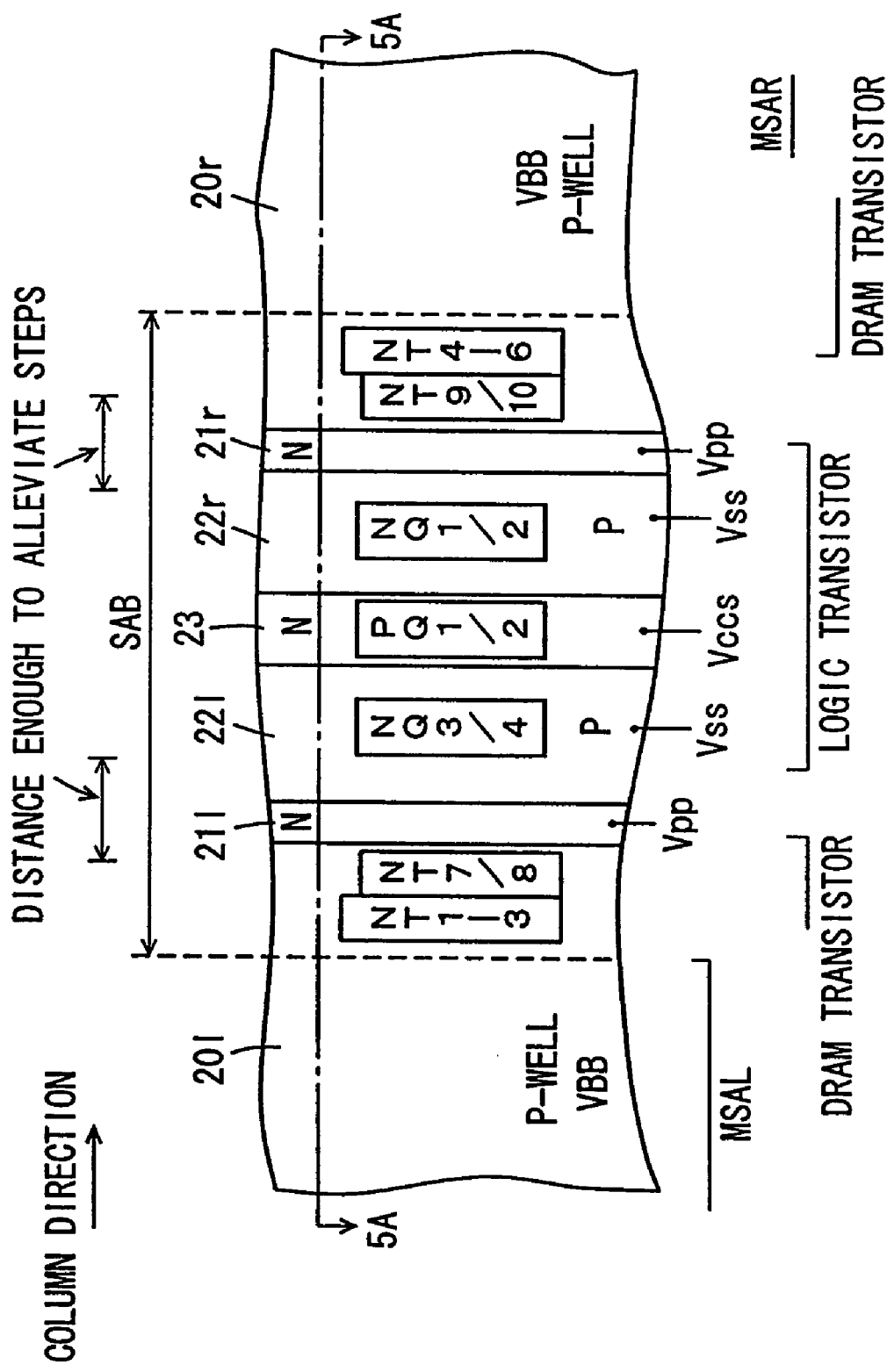
F I G. 5

F I G. 2 3 A
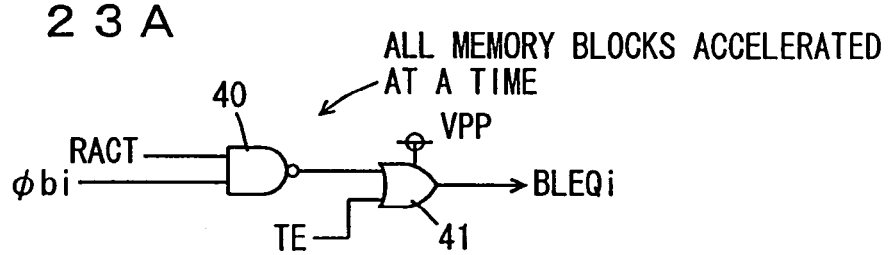
F I G. 2 3 B
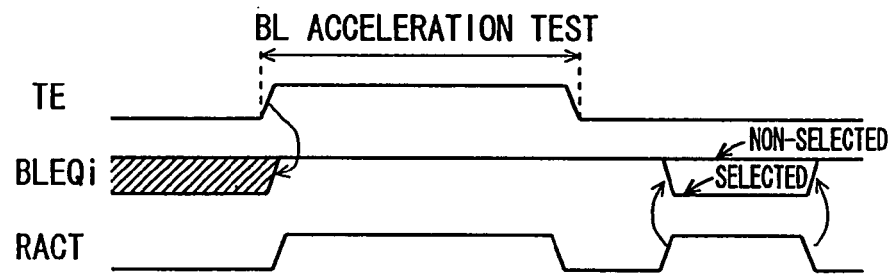
F I G. 2 4
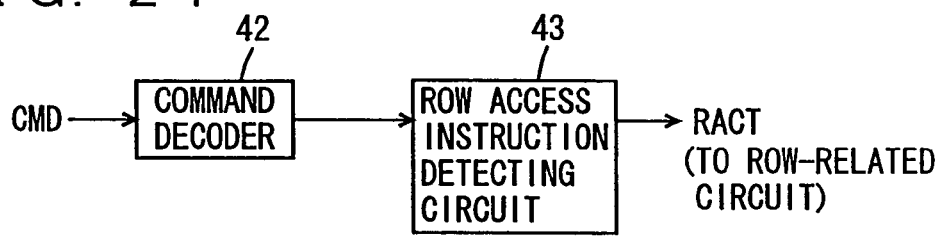
F I G. 2 5 A
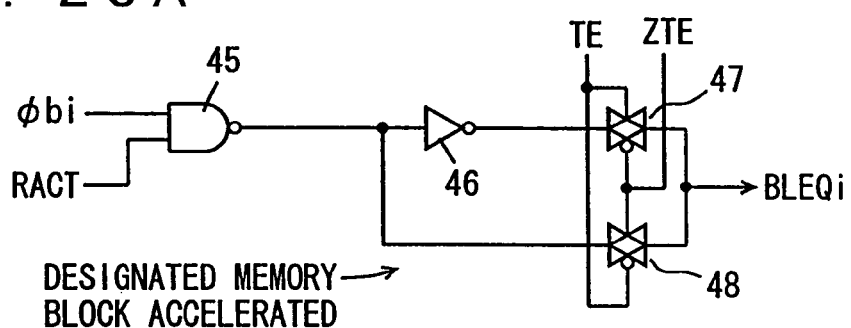
F I G. 2 5 B
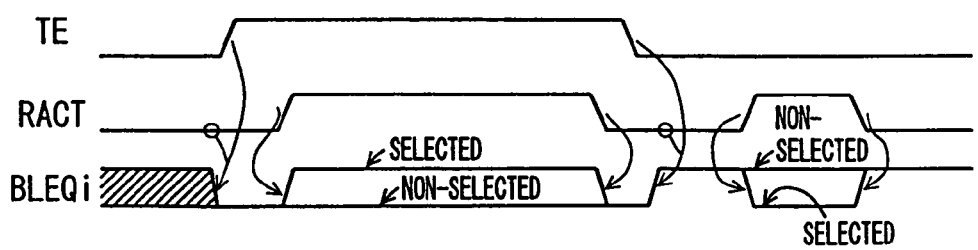

LTR
Low − Vth

DTR
M − Vth
Toxm > Toxl

SEMICONDUCTOR INTEGRATED CIRCUIT DEVICE HAVING LOGIC CIRCUIT AND DYNAMIC RANDOM ACCESS MEMORY ON THE SAME CHIP

This application is a continuation of Application Ser. No. 09/632,333 filed Aug. 3, 2000 now U.S. Pat. No. 6,649,984.

BACKGROUND OF THE INVENTION

1. Field of the Invention

The present invention relates generally to semiconductor integrated circuit devices and more specifically to a semiconductor integrated circuit device having a logic circuit and a dynamic random access memory (DRAM) merged on the same chip.

2. Description of the Background Art

In order to achieve high level processing at a high speed, semiconductor integrated circuit devices called "system LSI" or "logic-merged memory" having a memory and a logic circuit integrated on the same chip have been implemented.

FIG. 26 is a schematic diagram showing the general configuration of a conventional semiconductor integrated circuit device. In FIG. 26, semiconductor integrated circuit device 1 includes a logic circuit 2 to perform a prescribed processing and a DRAM (Dynamic Random Access Memory) circuit 3 which stores data to be used by logic circuit 2.

DRAM circuit 3 includes memory cell arrays MA0 to MA3 each having a plurality of DRAM memory cells arranged in a matrix of rows and columns and DRAM peripheral circuitry DPH placed in a cross-shaped central region among these memory cell arrays MA0 to MA3. DRAM peripheral circuitry DPH includes circuits to perform accessing operation to memory cell arrays MA0 to MA3 and data transfer between logic circuit 2 and DRAM circuit 3 and an internal voltage generating circuit to generate internal voltage.

In semiconductor integrated circuit device 1, data transfer between logic circuit 2 and DRAM circuit 3 is performed through internal interconnection lines on a chip on which semiconductor integrated circuit device 1 is formed. An internal data bus is no subject to limitation by the number of pin terminals, and therefore a large bit width is allowed for the internal data bus, so that the number of data bits which can be transferred at a time can be increased and high speed data transfer is implemented.

The data bus is formed of an internal interconnection line, and a control signal line between logic circuit 2 and DRAM circuit 3 is also an internal interconnection line. Such an internal interconnection line has a line capacitance smaller than the wires on a printed circuit board, can transfer data/signal at a high speed and can be driven with small current driving capability due to the small line capacitance, so that the current consumption can be significantly reduced. In such a semiconductor integrated circuit device having a DRAM circuit and a logic circuit merged, both the requirements for the reliability of the DRAM circuit and the high speed performance of the logic circuit must be satisfied.

FIG. 27A is a schematic cross sectional view of a MOS transistor which is a component of logic circuit 2 shown in FIG. 26. In FIG. 27A, the MOS transistor which is a component of logic circuit 2 (hereinafter referred to as "logic transistor LTR") includes high concentration impurity regions 2b and 2c formed on a surface of a semiconductor substrate region 2a, and a gate electrode layer 2d formed on a channel region between these impurity regions 2b and 2c with a gate insulating film 2e underlaid. Gate insulating film 2e has a film thickness, Toxl. Logic circuit 2 must operate at a high speed with low current consumption. To this end, the thickness Toxl of gate insulating film 2e of logic transistor LTR is made sufficiently small, and the absolute value Vth of the threshold voltage of the logic transistor is made sufficiently small. By making the absolute value of the threshold voltage small, logic transistor LTR is allowed to be set to a sufficiently deep on state even under a low power supply voltage condition, and the internal node (signal line) can be charged/discharged with large current driving capability.

FIG. 27B is a schematic cross sectional view of a MOS transistor (insulated gate field effect transistor) included in DRAM circuit 3. The MOS transistor which is a component of the DRAM circuit shown in FIG. 27B (hereinafter referred to as "DRAM transistor DTR") includes high concentration impurity regions 3b and 3c formed spaced apart on a surface of a semiconductor substrate region 3a and a gate electrode layer 3d formed on a channel region between impurity regions 3b and 3c, with a gate insulating film 3e underlaid. Gate insulating film 3e has a thickness Toxm.

The thickness Toxm of gate insulating film 3e of DRAM transistor DTR is made larger than the thickness Toxl of gate insulating film 2e in logic transistor LTR. In DRAM circuit 3, a selected word line is provided with a boosted voltage Vpp higher than the power supply voltage, and a bit line isolation gate to selectively connect a bit line and a sense amplifier circuit in a shared sense amplifier arrangement is similarly provided with a high voltage in order to reduce the threshold voltage loss. In order to maintain the reliability even if such high voltages are applied, the thickness Toxm of gate insulating film 3e in DRAM transistor DTR is made larger than that of logic transistor LTR.

In conventional semiconductor integrated circuit devices of this kind, Dual Oxide process has been employed, according to which such a DRAM transistor having a thick gate insulating film and a logic transistor having a thin gate insulating film are formed separately on the same chip. In this Dual Oxide process, after gate insulating films for a DRAM transistor and a logic transistor are formed in the same step, the DRAM transistor is masked using resist, and the gate insulating film of the logic transistor is made thin. Then, the gate insulating films for the DRAM transistor and logic transistor are once again made thick. In order to reduce damages of the logic transistor caused at the time of etching and improve the controllability of the thickness of the gate insulating films, the gate insulating film of the logic transistor is once made thin by etching and then thick by for example CVD.

In the DRAM circuit, MOS transistors included in DRAM peripheral circuitry DPH and memory cell arrays MA0 to MA3 are all DRAM transistors.

The logic transistor has a small absolute value for the threshold voltage, and therefore has large leakage current in an off state (off leakage current). In order to use the logic transistor in a DRAM circuit having a significantly large number of elements, leakage current in the DRAM circuit in a stand-by state is not negligible, which makes difficult the use of the logic transistor in the DRAM circuit.

In the DRAM transistor, the thickness Toxm of gate insulating film 3e is made larger and the absolute value of the threshold voltage is set higher. Meanwhile, a sense amplifier circuit to sense, amplify and latch memory cell data on bit lines as will be described is required to perform the sensing operation with high sensitivity and at a high speed, and the absolute value of the threshold voltage of the MOS transistor must be made small. Such different threshold voltages are implemented by adjusting the threshold voltage by ion-implantation into the channel regions.

If transistors required to have a small absolute value for the threshold voltage such as MOS transistors in sense amplifier circuits included in memory cell arrays MA0 to MA3 are formed by DRAM transistors as described above, the number of manufacturing steps and the number of masks increase for the purpose of adjusting the threshold voltages by ion-implantation to lower the threshold voltages, which pushes up the cost of the semiconductor integrated circuit device.

In addition, the DRAM peripheral circuitry includes MOS transistors of a relatively high threshold voltage and cannot operate as fast as the logic circuit.

However, if a logic transistor having a low threshold voltage (small absolute value for the threshold voltage) is used for a low threshold voltage MOS transistor in the DRAM circuit for the purpose of simplifying the manufacturing process, the following problems are encountered.

In the DRAM circuit, acceleration test to screen defective bits is performed. In the acceleration test, application voltage and operation temperature are set high. In the acceleration test, a high voltage is applied to a bit line in a memory cell array for accelerating the voltage of the memory cell capacitor. A sense amplifier circuit is provided for a bit line, and if a logic transistor is used for such a sense amplifier circuit, acceleration voltage is applied to the logic transistor. Since the logic transistor has a thin gate insulating film and therefore the breakdown voltage is small. As a result, the logic transistor would be destroyed during the acceleration test. Therefore, sufficiently high voltage cannot be applied to the bit line during the acceleration test, or relatively low acceleration voltage should be applied, and therefore time for the acceleration test increases because sufficient voltage stress must be applied. In addition, enough screening cannot be performed within a limited time period.

Furthermore, if a logic transistor is used in the DRAM circuit, the logic transistor is a low threshold voltage MOS transistor having large off leakage current, and the stand-by current of the DRAM circuit cannot be restrained to a low level.

SUMMARY OF THE INVENTION

It is an object of the present invention is to provide a semiconductor integrated circuit device capable of operating at a high speed without degrading the reliability of a DRAM circuit and without increasing the current consumption and the number of steps.

Another object of the present invention is to provide a semiconductor integrated circuit device capable of surely applying sufficiently high voltage to a bit line in an acceleration test for a DRAM circuit without increasing the number of manufacturing steps.

Briefly stated, a semiconductor integrated circuit device according to the present invention employs a logic transistor for MOS transistors in a DRAM circuit except for MOS transistors in a circuit supplied with a high voltage such as a word line drive circuit and an internal voltage generating circuit.

In the DRAM circuit, transistors other than those supplied with high voltage are formed of logic transistors. As a result, in the DRAM circuit, the MOS transistors supplied with high voltage are formed of DRAM transistors, and the breakdown voltage of these transistors is secured enough even if a high voltage is applied, so that high reliability is secured. In addition, the use of the logic transistor in the DRAM circuit secures high speed operation characteristic for the device.

The sense amplifier circuit is formed of a logic transistor, and therefore the sense amplifier circuit can be formed simultaneously with the formation of the logic circuit, which can restrain the numbers of masks and manufacturing steps from increasing.

By providing a bit line isolation transistor between a sense amplifier circuit and a bit line equalize circuit, the sense amplifier and the bit line equalize circuit can be isolated in an acceleration test, and high voltage can be applied to the bit line from the equalize circuit, so that sufficiently high acceleration voltage can be applied to the bit line without the adverse effect on the logic transistor of the sense amplifier circuit.

Furthermore, by deepening the back gate bias of the sense amplifier drive, off leakage current can be prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a schematic diagram showing the layout of the arrangement of each transistor in the circuit shown in FIG. 3;

FIG. 23A is a schematic diagram of the configuration of the bit line equalize instruction signal generating portion according to the fourth embodiment;

FIG. 23B is a signal waveform diagram representing the operation of the circuit shown in FIG. 23A;

FIG. 24 is a schematic diagram of the configuration of an array activation signal generating portion shown in FIG. 23A;

FIG. 25A is a schematic diagram of another configuration of the bit line equalize instruction signal generating portion according to the fourth embodiment;

FIG. 25B is a signal waveform diagram representing the operation of the circuit in FIG. 25A;

DESCRIPTION OF THE PREFERRED EMBODIMENTS

First Embodiment

Figure 1:
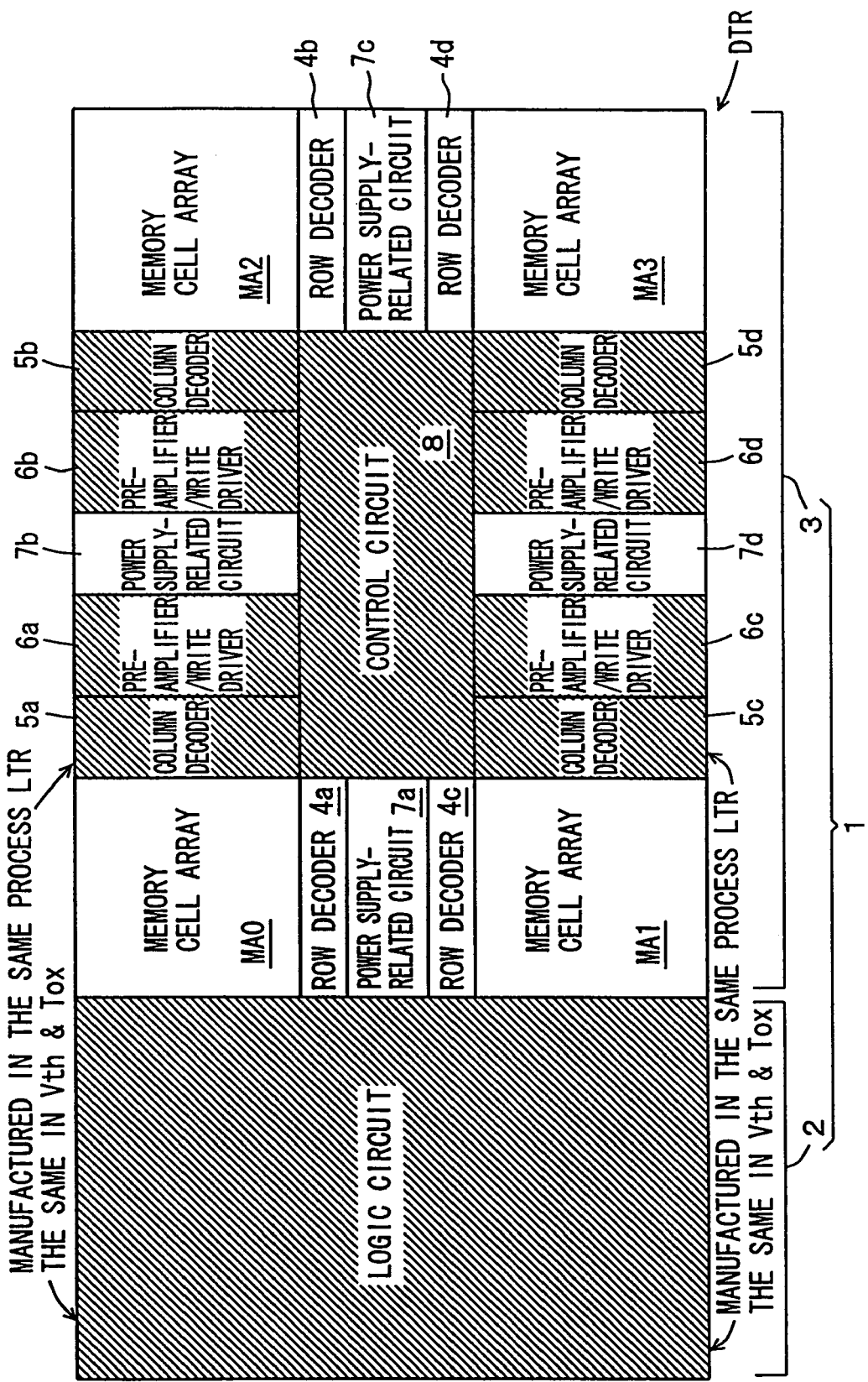
FIG. 1 is a schematic diagram of an entire configuration of a semiconductor integrated circuit device according to a first embodiment of the present invention.

FIG. 1 is a schematic diagram of an entire configuration of a semiconductor integrated circuit device according to a first embodiment of the present invention. In FIG. 1, semiconductor integrated circuit device 1 includes a logic circuit 2 including as a component of a logic transistor LTR, and a DRAM circuit 3 in which peripheral circuit includes a logic transistor LTR formed in the same manufacturing process as the logic transistor of logic circuit 2.

DRAM circuit 3 includes memory cell arrays MA0 to MA3 provided in quad-divided regions in the region of DRAM circuit 3 and each having a plurality of memory cells arranged in a matrix of rows and columns, row decoders 4a to 4d provided corresponding to memory cell arrays MA0 to MA3, respectively to drive an addressed row (word line) in a corresponding memory cell array into a selected state, column decoders 5a to 5d provided corresponding to memory cell arrays MA0 to MA3 to generate a column selecting signal for selecting an addressed column, preamplifier/write drivers 6a to 6d provided corresponding to column decoders 5a to 5d, respectively to communicate data with a column selected by corresponding column decoders 5a to 5d, and a control circuit 8 provided in the central part of DRAM circuit 3 to control accessing operation to these memory cell arrays MA0 to MA3.

Control circuit 8 generates a control signal to control the internal operation of DRAM circuit 3 according to a control signal (command) applied from logic circuit 2.

DRAM circuit 3 further includes a power supply-related circuit 7a provided in a region between row decoders 4a and 4c, a power supply-related circuit 7c provided in a region between row decoders 4b and 4d, a power supply-related circuit 7b provided in a region between preamplifier/write drivers 6a and 6b, and a power supply-related circuit 7d provided in a region between preamplifier/write drivers 6c and 6d. Power supply-related circuits 7a to 7d each include a voltage-down circuit to generate an array power supply voltage by down-converting externally applied power supply voltage, a boosting circuit to generate a high voltage Vpp transmitted onto a selected word line, a negative voltage generating circuit to generate a negative voltage VBB used for substrate biasing or the like, a bit line precharge voltage generating circuit to generate a bit line precharge/equalize voltage VBL, and a cell plate voltage generating circuit to generate a cell plate voltage VCP applied to the cell plate of a memory cell capacitor.

In the DRAM peripheral circuitry, column decoders 5a to 5d, preamplifier/write drivers 6a to 6d and control circuit 8 each include logic transistor LTR as a component. The logic transistor has a thin gate insulating film and a small absolute value for the threshold voltage as described previously. As a result, by using the logic transistors as components for control circuit 8, column decoders 5a to 5d, and preamplifier/write drivers 6a to 6d, these circuit portions can be operated under a low power supply voltage condition. Column decoders 5a to 5d and preamplifier/write drivers 6a to 6d are column-related circuits operating at the time of column selecting operation, and are smaller in number than circuits related to row selection provided in a memory cell array and the unit decode circuits included in a row decoder. Therefore, if logic transistors LTR are used for column decoders 5a to 5d, preamplifier/write drivers 6a to 6d and control circuit 8, the off leakage current is small since the number of logic transistors used is small, and increase in the current consumption in a stand-by state will not cause any particular problems.

DRAM transistors having a thick insulating film are used for memory cell arrays MA0 to MA3 and row decoders 4a to 4d. Thus, if boosted voltage VPP is applied on a selected word line, the breakdown voltage characteristic can be surely secured.

In power supply-related circuits 7a to 7d, when externally applied voltage is received, relatively high voltage is applied. Power supply-related circuits 7a to 7d must stably generate internal voltage at an accurate voltage level, and these power supply-related circuits substantially perform analog operations (such as current mirror and source follower mode operations), and a DRAM transistor having a large absolute value for the threshold voltage is used in order to restrain the influence of the off leakage current and secure accurate internal voltage generating operation. Thus, internal voltage at a desired voltage level can be stably generated.

For logic circuit 2, a column-related circuit in DRAM peripheral circuitry and control circuit 8, logic transistors formed in the same manufacturing process are used as components. The MOS transistors formed in the same manufacturing process have the same thickness and material for their gate insulating films and their gate electrode layers, the same impurity concentration profile for their channel regions and the same threshold voltage.

As described above, according to the first embodiment, the column-related circuit and control circuit in the DRAM circuit are formed of logic transistors formed in the same manufacturing process as that of the MOS transistors in the logic circuit, and therefore a DRAM circuit capable of operating at a high speed even under a low power supply voltage condition without increase in the leakage current in a stand-by state can be implemented. More specifically, a circuit which has an insignificant amount of off leakage current and is not provided with high voltage includes a MOS transistor formed in the same manufacturing process as the logic circuit, so that a DRAM circuit operating at a high speed while maintaining its stand-by current at a level equal to or lower than the permissible value can be provided and a semiconductor integrated circuit device operating at a high speed can be implemented accordingly.

Second Embodiment

Figure 2:
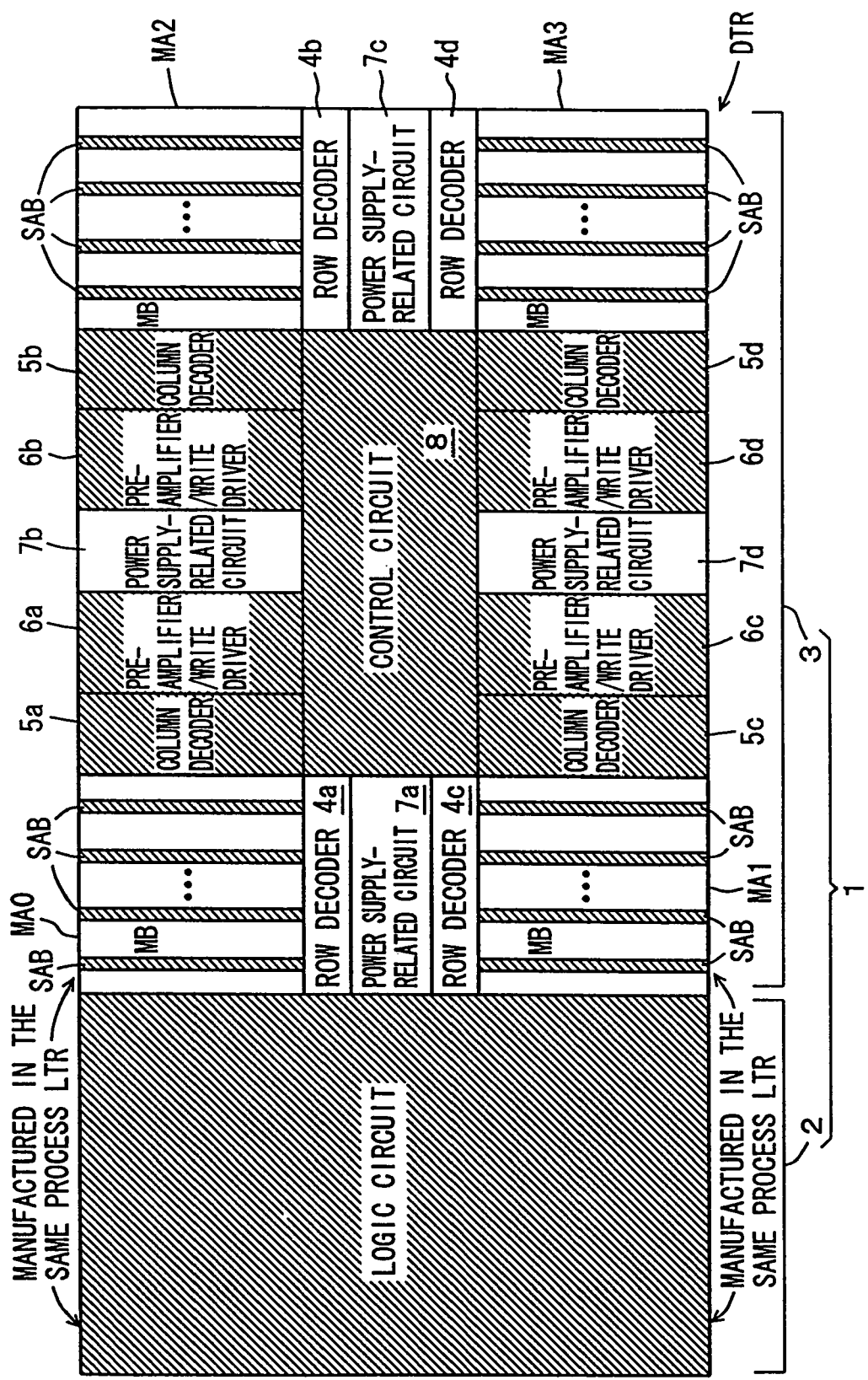
FIG. 2 is a schematic diagram of an entire configuration of a semiconductor integrated circuit device according to a second embodiment of the present invention.

FIG. 2 is a schematic diagram of an entire general configuration of a semiconductor integrated circuit device according to a second embodiment of the present invention. In semiconductor integrated circuit device 1 shown in FIG. 2, memory cell arrays MA0 to MA3 are each divided into a plurality of memory cell blocks MB by sense amplifier bands SAB extending in the direction along the rows (hereinafter "row direction"). Sense amplifier band SAB includes a sense amplifier circuit provided corresponding to each column of memory cell blocks. The sense amplifier circuit is formed of a MOS transistor formed in the same manufacturing process as logic transistor LTR included in logic circuit 2.

Column decoders 5a to 5d are provided in common to memory cell blocks MBs included in corresponding memory cell arrays MA0 to MA3. In DRAM circuit 3, 128-bit memory cells for example are selected simultaneously in a column selecting operation in memory cell arrays MA0 to MA3. As a result, the number of unit decode circuits included in each of column decoders 5a to 5d is sufficiently smaller than the number of unit row decode circuits included in row decoder 4a. Similarly to the first embodiment described above, column decoders 5a to 5d and preamplifier/write drivers 6a to 6d, the row-related circuits are formed by the same logic transistors as the logic transistor which is a component of logic circuit 2, so that high speed operation can be implemented while restraining increase in the off leakage current. In addition, control circuit 8 includes a logic transistor similarly to the first embodiment, and operates at a high speed according to a control signal and an address signal from logic circuit 2.

Row decoders 4a to 4d and power supply-related circuits 7a to 7d are formed by DRAM transistors similarly to the first embodiment.

Sense amplifier circuits included in sense amplifier band SAB include logic transistors, so that the step of ion-implantation for adjusting the threshold of a MOS transistor, i.e., a component of the sense amplifier circuit can be eliminated, which can reduce the number of masks and the number of steps. Memory cells included in memory block MB each include a DRAM transistor.

Figure 3:
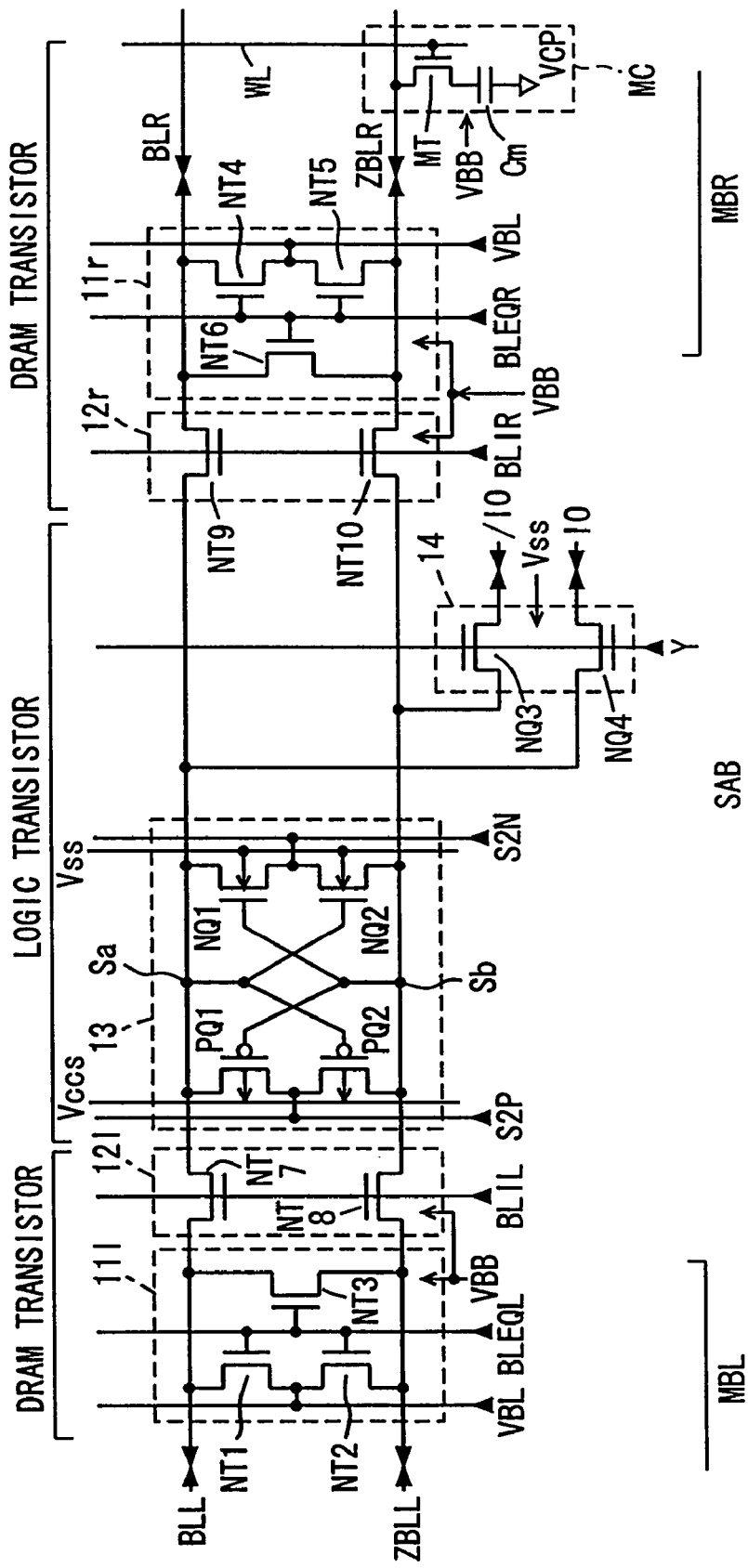
FIG. 3 is a diagram showing in detail the configuration of a sense amplifier band in the semiconductor integrated circuit device shown in FIG. 2.

FIG. 3 is a diagram of the configuration of a portion related to one sense amplifier circuit according to the second embodiment. In FIG. 3, sense amplifier band SAB is shared by memory blocks MBL and MBR. Provided in sense amplifier band SAB are a sense amplifier circuit 13 and a column selecting gate 14 to connect sense amplifier circuit 13 to internal data lines IO and /IO (which are not shown) according to a column selecting signal Y.

Sense amplifier circuit 13 is provided with bit lines BLL and ZBLL in memory block MBL and with bit lines BLR and ZBLR in memory block MBR. Memory cells MC are provided corresponding to crossing portions of bit lines BLL and ZBLL and bit lines BLR and ZBLR and word lines WL (sub word lines) which are not shown. FIG. 3 shows a memory cell MC provided corresponding to the crossing portion of word line WL and complementary bit line ZBLR in memory block MBR by way of illustration. Memory cell MC includes a memory cell capacitor Cm to receive cell plate voltage VCP at the cell plate electrode and store information, and a memory transistor MT to conduct in response to voltage on word line WL and connect memory cell capacitor Cm to bit line ZBLR. Since memory cell transistor MT is provided with boosted voltage VPP when selected, a DRAM transistor having a thick gate insulating film is used therefor.

Bit lines BLL and ZBLL are provided with a bit line equalize circuit 11l to conduct, during an activation of a bit line equalize instruction signal BLEQL and transmit a bit line equalize voltage VBL to bit lines BLL and ZBLL, and a bit line isolation gate 12l to connect bit lines BLL and ZBLL to sense amplifier circuit 13 according to bit line isolation instruction signal BLIL.

Bit lines BLR and /BLR are provided with a bit line equalize circuit 11r to also conduct, during an activation of bit line equalize instruction signal BLEQR, for transmitting a bit line precharge voltage VBL to bit lines BLR and ZBLR, and a bit line isolation gate 12r to connect bit lines BLR and ZBLR to sense amplifier circuit 13 according to bit line isolation instruction signal BLIR.

Bit line equalize circuit 11l includes an equalize N-channel MOS transistor NT3 to conduct, in response to bit line equalize instruction signal BLEQL, for equalizing bit lines BLL and ZBLL, and N-channel MOS transistors NT1 and NT2 to transmit bit line precharge voltage VBL to bit lines BLL and ZBLL in response to bit line equalize instruction signal BLEQL.

Bit line isolation gate 12l includes N-channel MOS transistors NT7 and NT8 to conduct when a bit line isolation instruction signal BLIL is at an H level and connect bit lines BLL and ZBLL to sense nodes Sa and Sb, respectively.

Bit line equalize circuit 11r includes precharge N-channel MOS transistors NT4 and NT5 to conduct in response to bit line equalize instruction signal BLEQR, for transmitting precharge voltage VBL to bit lines BLR and ZBLR, and equalize N-channel MOS transistor NT6 to conduct in response to bit line equalize instruction signal BLEQR for interconnecting bit lines BLR and ZBLR.

Bit line isolation gate 12r includes N-channel MOS transistors NT9 and NT10 to conduct when bit line isolation instruction signal BLIR is at an H level for connecting bit lines BLR and ZBLR to sense nodes Sa and Sb, respectively.

Bit line equalize circuits 11l and 11r are provided for a pair of bit lines BLL and ZBLL and a pair of bit lines BLR and ZBLR, respectively, and these bit lines BLL and ZBLL, BLR and ZBLR can be precharged/equalized at a high speed, so that so called RAS precharge time tRP can be shortened and the cycle time can be reduced.

Bit line equalize instruction signals BLEQL and BLEQR are set at a voltage level higher than an array power supply voltage Vccs, to transmit precharge voltage VBL to bit lines BLL, BLR, ZBLL and ZBLR. As a result, MOS transistor NT1 to NT6 included in these bit line equalize circuits 11l and 11r are formed of DRAM transistors. In order to stabilize the threshold voltage of MOS transistors NT1 to NT6, negative voltage VBB is applied to the back gates of these transistors. Back gate bias voltage VBB is also applied to the back gate of memory cell transistor MT.

Bit line isolation gates 12*l* and 12*r* receive bit line isolation signal BLIL or BLIR at boosted voltage VPP level to transmit readout voltage to sense amplifier circuit 13 at a high speed, and restore data amplified by sense amplifier circuit 13 to a memory cell. As a result, MOS transistors NT7 to NT10 for these bit line isolation gates 12*l* and 12*r* are formed of DRAM transistors. Negative bias voltage VBB is also applied to the back gates of MOS transistors NT7 to NT10.

Sense amplifier circuit 13 includes cross-coupled P-channel transistors PQ1 and PQ2, and cross-coupled N-channel MOS transistors NQ1 and NQ2. MOS transistors PQ1 and NQ1 form a CMOS inverter with sense node Sb being an input node and sense node Sa being an output node, while MOS transistors PQ2 and NQ2 form a CMOS inverter with sense node Sa being an input node and sense node Sb being an output node.

MOS transistors PQ1, NQ1, PQ2 and NQ2 in sense amplifer circuit 13 preferably have as small an absolute value as possible for the threshold voltage in view of sensing sensitivity and speed. (A minute potential difference can be amplified at a high speed.) As a result, logic transistors are used for sense amplifier circuit 13 as MOS transistors PQ1, NQ1, PQ2 and NQ2. In order to reduce the absolute value of the threshold voltage as much as possible, array power supply voltage Vccs is applied to the back gate of MOS transistor PQ1, PQ2, while ground voltage Vss is applied to the back gate of MOS transistor NQ1, NQ2.

Column selecting gate 14 includes N-channel MOS transistors NQ3 and NQ4 to connect sense nodes Sb and Sa to internal data lines /IO and IO, respectively in response to column selecting signal Y. Column selecting gate 14 must transfer data signals between internal data lines IO, /IO and sense nodes Sb and Sa as fast as possible and without loss by the threshold voltage. Therefore, logic transistors are used as MOS transistors NQ3 and NQ4 for column selecting gate 14.

The back gates of MOS transistors NQ3 and NQ4 are provided with ground voltage Vss to reduce the threshold voltage as much as possible.

As shown in FIG. 3, the use of the logic transistors for sense amplifier circuit 13 permits the sense amplifier circuit to be formed in the same manufacturing process as the logic circuits. Therefore, the step of ion-implantation for adjusting the threshold voltage, which is required if DRAM transistors are used for sense amplifier circuit 13, is not necessary, so that the number of masks and the number of manufacturing steps can be reduced.

Note that array (sense) power supply voltage Vccs applied to sense amplifier circuit 13 is about 2.0V, and the operation power supply voltage of a logic circuit is about 1.8V. If a transistor having a gate insulating film as thick as that of a logic transistor which is a component of the logic circuit for sense amplifier circuit 13, voltage applied to their gates is about at a same level as the operation power supply voltage of the logic circuit, and therefore breakdown voltage can be sufficiently secured.

Figure 4:
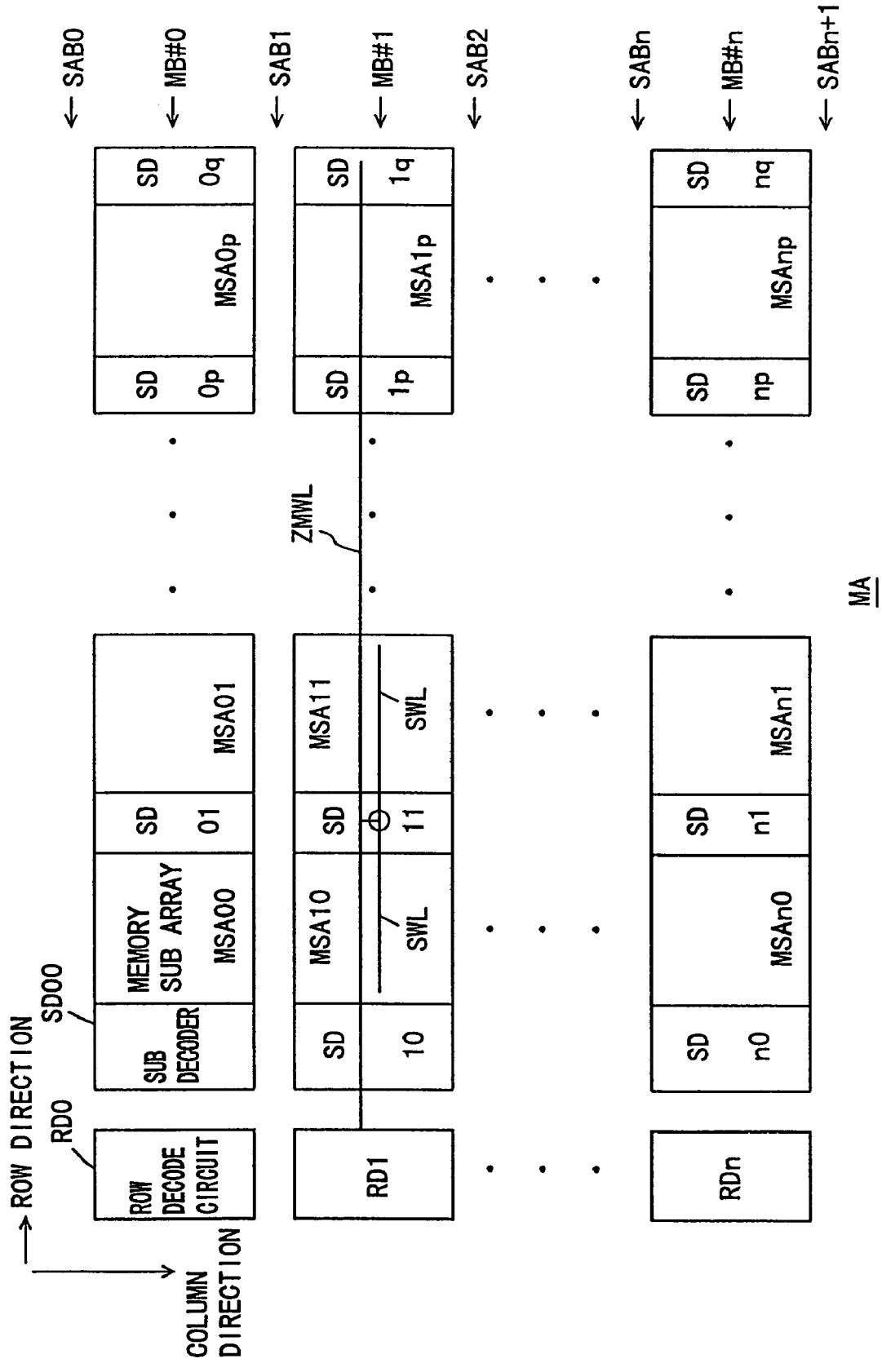
FIG. 4 is a schematic diagram of the arrangement of memory cell arrays in the DRAM circuit shown in FIG. 2.

FIG. 4 is a schematic block diagram of the arrangement of one memory cell array. Memory cell array MA (MA0 to MA3) is divided into a plurality of memory row blocks MB#0 to MB#n. Memory row blocks MB#0 to MB#n each include a plurality of memory cell sub arrays MSAi0 to MSAip arranged in alignment in the row direction.

Memory row blocks MB#0 to MB#n are provided with row decode circuits RD0 to RDn to decode a row address signal, respectively. In memory row block MB#i (i=0 to n), a main word line ZMWL to transmit a row selecting signal from row decode circuit RDi extending in the row direction is provided in common to memory sub arrays MSAi0 to MSAip.

Memory sub arrays MSAi0 to MSAip each include a sub word line SWL provided corresponding to a row of memory cells and connecting memory cells in a corresponding row. Memory sub arrays MSAi0 to MSAip are provided with word line sub decoders SDi0 to SDiq, respectively. Word line sub decode circuits are formed alternately on both sides of memory sub array MSAij. The word line sub decoder includes a word line sub decode circuit to drive together sub word lines in adjacent memory sub arrays into a selected state in response to at least a signal potential on a corresponding main word line ZMWL, for example, in memory sub arrays MSA10 and MSA11 as shown in FIG. 4. The word line sub decode drive circuits are provided alternately on both sides of memory sub arrays in the direction along the columns (hereinafter as "the column direction"), so that the pitch condition of the word line sub decode circuits can be alleviated.

Sense amplifier bands SAB1 to SABn are provided between memory row blocks adjacent in the column direction, and sense amplifier bands SAB0 and SABn+1 are provided on the outer side of memory row blocks MB#0 and MB#n, respectively. In sense amplifier bands SAB1 to SABn, the configuration in FIG. 3 is provided to each column (bit line pair) of each corresponding memory sub array.

FIG. 5 is a schematic block diagram of the circuit layout of a sense amplifier band. Memory sub arrays MSAL and MSAR are formed in P-type wells 20*l* and 20*r*, respectively. Memory cells MC are provided on P wells 20*l* and 20*r*.

P wells 20*l* and 20*r* are isolated from one another by bottom N wells. (wall regions reaching bottom N well) 21*l* and 21*r*. A P-type substrate region is provided between bottom N wells 21*l* and 21*r*, and is divided into P-type substrate regions 22*l* and 22*r* by N well 23 provided on a surface region of in the central portion of P-type substrate regions.

P wells 20*l* and 20*r* are provided with a negative voltage VBB as a bias voltage in order to stabilize the threshold voltage of a memory cell transistor. Meanwhile, bottom N wells 21*l* and 21*r* are provided with high voltage VPP, while P-type substrate regions 22*l* and 22*r* are provided with ground voltage Vss. N well 23 is provided with array power supply voltage Vccs.

On the surface of P well 20*l*, equalize N-channel MOS transistors NT1 to NT3 shown in FIG. 3 are formed in the vicinity of bottom N well (wall region) 21*l*. In the close proximity of equalize N-channel MOS transistor NT1 to NT3 and on the surface of substrate region 20*l*, MOS transistors NT7 and NT8 for the bit line isolation gate shown in FIG. 3 are formed.

On the surface of substrate region 22*l*, MOS transistors NQ3 and NQ4 included in column selecting gate 14 are formed, and N-channel MOS transistors NQ1 and NQ2 for sense amplifier circuit 13 shown in FIG. 3 are formed in substrate region 22*r*.

P-channel MOS transistors PQ1 and PQ2 in sense amplifier circuit 13 shown in FIG. 3 are formed in the central N well 23.

MOS transistors NQ1 to NQ4 and MOS transistors PQ1 and PQ2 are logic transistors and have a thin gate insulating film. The absolute value of the threshold voltage of the MOS transistors in the sense amplifier circuit are preferably as small as possible, and therefore these substrate regions 22*l* and 22*r* are biased to ground voltage Vss, and N well 23 is biased to array power supply voltage Vccs. Bit line isolation gate MOS transistors NT7 to NT10 and equalize MOS transistors NT1 to NT6 are DRAM transistors and formed in the same P well region as the memory cell and receive negative voltage VBB at their back gates.

Figure 6:
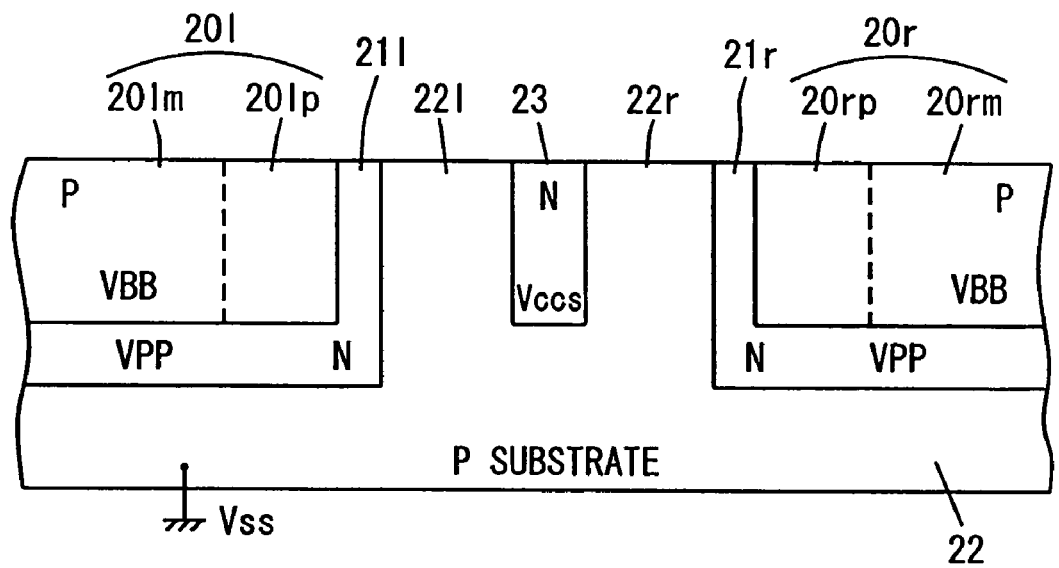
FIG. 6 is a schematic cross sectional view taken along line 5A to 5A in FIG. 5.

FIG. 6 is a cross sectional view taken along line 5A—5A in FIG. 5. As shown in FIG. 6, bottom N well 21*l* is formed to surround P well 20*l* in the column direction and N well 21*r* is formed to surround P well 20*r* in the column direction. Bottom well 21*l* and 21*r* are buried within P-type substrate 22, and by biasing bottom N wells 21*l* and 21*r* to high voltage VPP, electron-hole pairs generated by radiation or substrate current can be absorbed by bottom N wells 21*l* and 21*r*, so that electrons generated by noise will not be stored in the capacitors of memory cells formed in P wells 20*l* and 20*r* and soft errors can be prevented.

P well 20*l* and 20*r* include regions 20*lm* and 20*rm* in which memory cells are formed and a peripheral region 20*lp* and 20*rp* in which bit line precharge circuits 11*l* and 11*r* and bit line isolation gates 12*l* and 12*r* in the peripheral region are formed. By isolating bottom N wells 21*l* and 21*r* in the column direction, logic transistors which are elements of a sense amplifier circuit and a column selecting circuit can be formed and the absolute value of their threshold voltages can be reduced.

Bottom N wells 21*l* and 21*r* are isolated in the column direction, and no transistor is formed in a wall region extending to the substrate surface (the terminating regions of the bottom wells). The wall region is a general N well and formed after a bottom base well is formed. The distance between MOS transistors forming a bit line isolation gate and an equalize circuit and N-channel MOS transistors forming a column selecting gate and a sense amplifier circuit can be set larger by the wall regions (terminating regions) of bottom N wells 21*l* and 21*r*. Therefore, the distance between a DRAM transistor and a logic transistor can be sufficiently secured, a resist pattern can be accurately formed without being affected by halation at the time of exposure in patterning, even if the gate insulating films have different thicknesses and the steps in this region are large. During etching, over-etching by reflection of injected ions in the stepped region can be prevented, so that a DRAM transistor and a logic transistor accurately having a desired characteristic (pattern and feature size, gate insulating film thickness) can be formed in regions relatively close to each other.

Note that bottom N wells 21*l* and 21*r* may be biased to array power supply voltage Vccs. However, for the arrangement of word line sub decode circuits as will be described, an N well biased to high voltage VPP is necessary. P wells 20*l* and 20*r*, and bottom N wells 21*l* and 21*r* are in a reverse bias state, and the bottom N well needs only to be biased to the voltage level at which impact ions by the substrate current or electrons by radiation are absorbed.

Figure 7:
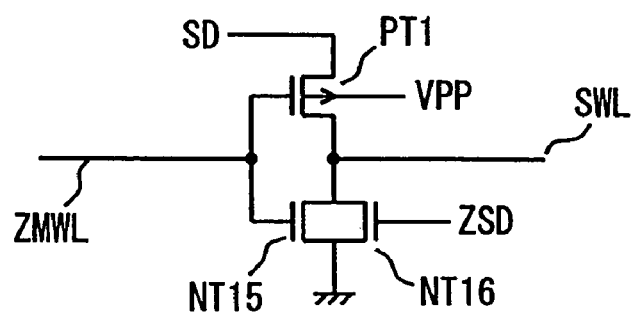
FIG. 7 is a diagram of the configuration of a sub decode circuit included in a sub decoder shown in FIG. 4.

FIG. 7 is a diagram of the configuration of a word line sub decode circuit included in sub decoders SD00 to SDnq. In FIG. 7, the word line sub decode circuit includes a P-channel MOS transistor PT1 to conduct, when a signal on main word line ZMWL is at the ground voltage level, for transmitting a sub decode signal SD onto sub word line SWL, an N-channel MOS transistor NT15 to conduct, when a signal on main word line ZMWL is at an H level, for driving sub word line SWL to the ground voltage level, and an N-channel MOS transistor NT16 to conduct, when sub decode signal ZSD is at an H level, for discharging sub word line SWL to the ground voltage level.

In MOS transistors PT1, NT15 and NT16, sub decode signal SD has an amplitude of boosted voltage VPP level, and these transistors are formed of DRAM transistors. Sub decode signal ZSD is a signal complementary to sub decode signal SD and has an amplitude of 0–Vccs.

One main word line ZMWL is provided for a plurality of sub word lines in one memory cell sub array, and one of the plurality of sub word lines is selected in response to sub decode signal SD. When main word line ZMWL is in a non-selected state at boosted voltage VPP level, MOS transistor PT1 is in a non-conductive state, MOS transistor NT15 conducts, and sub word line SWL is maintained at the ground voltage level and in a non-selected state regardless of the logic level of sub decode signal SD.

When main word line ZMWL is driven to the ground voltage in a selected state, MOS transistor PT1 conducts, while MOS transistor NT15 attains a non-conductive state. When sub decode signal SD is at the ground voltage level, MOS transistor PT1 cannot drive sub word line SWL to the ground voltage level. (A voltage drop corresponding to threshold voltage is generated in this MOS transistor PT1.) In order to prevent sub word line SWL from attaining a floating state, sub decode signal ZSD attains an H level, to MOS transistor NT16, so that sub word line SWL is maintained at the ground voltage level.

When sub decode signal SD is in a selected state and at the high voltage (boosted voltage) VPP level, high voltage VPP is transmitted to sub word line SWL through MOS transistor PT1. At this time, decode signal ZSD is at an L level, and MOS transistor NT16 is in a non-conductive state. The word line sub decode circuit is provided with high voltage VPP, the amplitude of sub decode signal SD is of high voltage VPP level, and main word line ZMWL has an amplitude of high voltage VPP level. As a result, the circuits related to row selection (including a row decoder) are formed of DRAM transistors.

Figure 8:
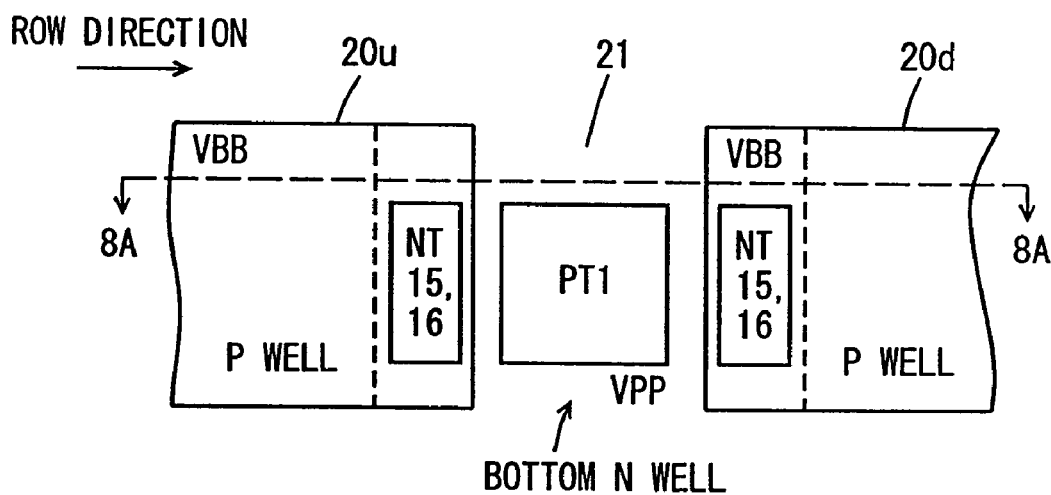
FIG. 8 is a schematic diagram of the layout of each transistor in the sub decoder shown in FIG. 7.

FIG. 8 is a schematic diagram of the layout of the word line sub decode circuit shown in FIG. 7. In FIG. 8, memory cells are formed on the surfaces of p wells 20*u* and 20*d*. P wells 20*u* and 20*d* are aligned in the row direction and receive bias voltage VBB. These P well 20*u* and 20*d* are isolated in the row direction by bottom N well 21 in order to provide a sub decoder band.

In regions of P wells 20*u* and 20*d* in the close proximity to the sub decoder band, N-channel MOS transistors NT15 and NT16 to discharge sub word lines are formed. On the surface of bottom N well 21 between P wells 20*u* and 20*d*, P-channel MOS transistor PT1 is formed. The back gates of MOS transistors NT15 and NT16 are biased to negative voltage VBB. Meanwhile, the back gate of P-channel MOS transistor is biased to high voltage VPP.

Figure 9:
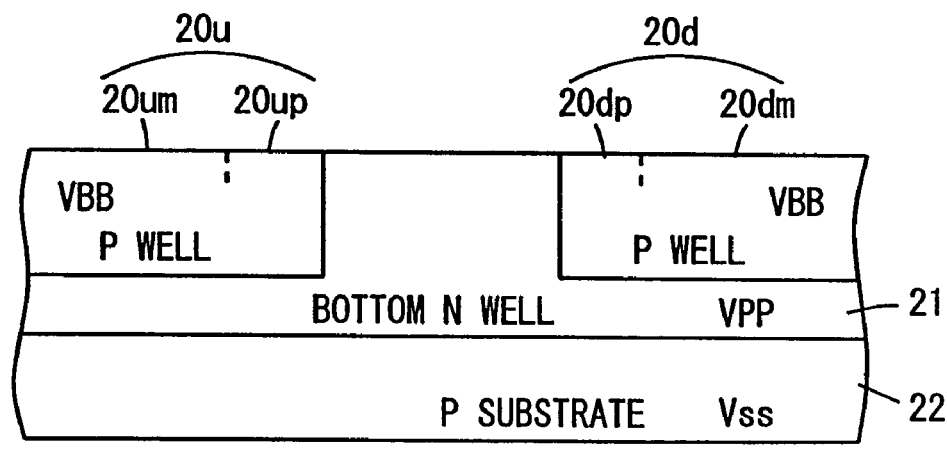
FIG. 9 is a schematic cross sectional view taken along line 8A to 8A in FIG. 8.

FIG. 9 is a schematic cross sectional view taken along line 8A to 8A in FIG. 8. Bottom N Well 21 is formed on the surface of a P substrate 22. On the surface of bottom N well 21, P wells 20*u* and 20*d* are formed apart from each other. Bottom N well 21 is formed to have its surface exposed in the region between P wells 20*u* and 20*d*. P wells 20*u* and 20*d* include respective memory cell regions 20*um* and 20*dm* in which memory cells are formed on the surface thereof, and respective sub decoder transistor formation regions 20*up* and 20*dp* located close to a sub decoder band for forming sub decoders.

In this configuration, MOS transistors NT15 and NT16 in the word line sub decode circuit may be formed in the same well region as the memory cell formation region, in which no other separate well region is necessary to reduce the area occupied by the sub decoder band. The back gates of MOS transistors NT15 and NT16 for discharging the word line sub decode circuit may be biased to ground voltage Vss. In this case, a P well is further formed in the region in the center of the sub decoder band in bottom N well 21 shown in FIG. 9, and the P well is biased to the ground voltage. In the case, P-channel MOS transistor PT1 is formed in the bottom N well regions on both sides of the P well biased to the ground voltage.

As described above, according to the second embodiment, since the sense amplifier circuit and column selecting gate are formed of logic transistors, the masks and manufacturing steps for adjusting the threshold voltage of a sense amplifier transistor is not necessary, so that the process of manufacturing a DRAM circuit can be simplified.

In the column direction, the bottom N wells surrounding the P well for arranging memory cells are isolated to expose the substrate region, and the sense amplifier circuit and column selecting gate are provided therein, so that a logic transistor can be readily formed without employing a complicated configuration, and the back gate bias can be set at a desired voltage level to take full advantage of the logic transistor which has a low threshold voltage.

Third Embodiment

Figure 10:
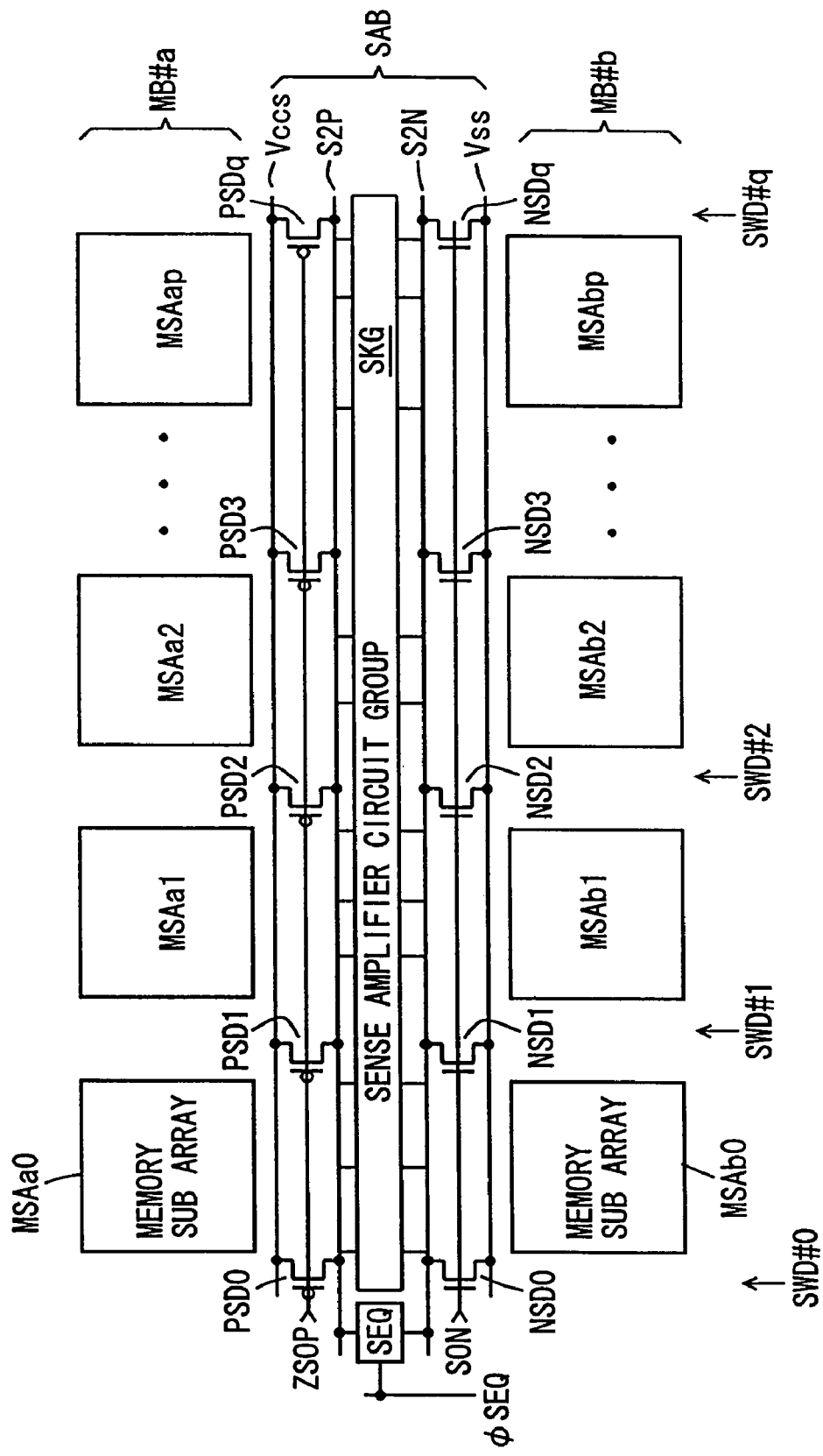
FIG. 10 is a schematic diagram of the configuration of a sense amplifier band in a semiconductor integrated circuit device according to a third embodiment of the present invention.

FIG. 10 is a schematic diagram of a main part of a semiconductor integrated circuit device according to a third embodiment of the present invention. In FIG. 10, the configuration of sense amplifier band SAB between 2 memory row blocks MB#a and MB#b are schematically shown. In sense amplifier band SAB, a sense amplifier circuit group SKG including a sense amplifier circuit provided corresponding to each bit line pair of memory row blocks MB#a and MB#b is provided. The source nodes of the sense amplifier circuit included in sense amplifier circuit group SKG are coupled to a P drive signal line S2P and an N drive signal line S2N, respectively.

Sense (array) power supply line Vccs and sense ground line Vss are formed in parallel to P drive signal line S2P and N drive signal line S2N.

In the crossing regions of the sense amplifier band sub decoder bands SWD#0 to SWD#q between memory sub arrays adjacent in the row direction, P-channel MOS transistors PSD0 to PSDq to conduct in response to an activation of sense amplifier activation signal ZSOP are provided between sense power supply line Vcc and P drive signal line S2P, and N-channel MOS transistors NSD0 to NSDq to conduct in response to an activation of sense amplifier activation signal SON are provided between sense ground line Vcc and N drive signal line S2N.

By connecting together the source nodes of sense amplifier circuits by each of P drive signal line S2P and N drive signal Line S2N, a potential distribution generated at the source nodes of the sense amplifier circuits is prevented, and the sense operation condition of each sense amplifier circuit is equalized. MOS transistors PSD0 to PSDq and NSD0 to NSDq for sense amplifier drive are provided in the crossing region (cross band) of the sense amplifier band and sub decoder bands, and therefore no memory cell is present in the region, which allows a MOS transistor having a relatively large gate width to be provided, so that charge/discharge current can be supplied to sense amplifier circuits with sufficient margin.

Sense amplifier drive transistors PSD0 to PSDq and NSD0 to NSDq must have their off leakage current reduced enough in a stand-by state. This is because sense drive signal lines S2P and S2N are precharged to an intermediate voltage level similar to that of the bit lines by an equalize circuit SEQ. In the sense amplifier circuit, as shown in FIG. 3, when drive signal lines S2P and S2N are precharged to the intermediate voltage level, MOS transistors PQ1, PQ2, NQ1 and NQ2 have their gates, drains and sources all pulled to the same voltage level, and there is no off leakage current flow.

The total number of sense amplifier drive transistors is the product of the number of sense amplifier bands and the number of sub decoder bands, which is relatively large and makes the total gate width large as well, and therefore drive transistors PSD0 to PSDq and NSD0 to NSDq must have a high absolute value for their threshold voltage in order to reduce off leakage current.

Figure 11:
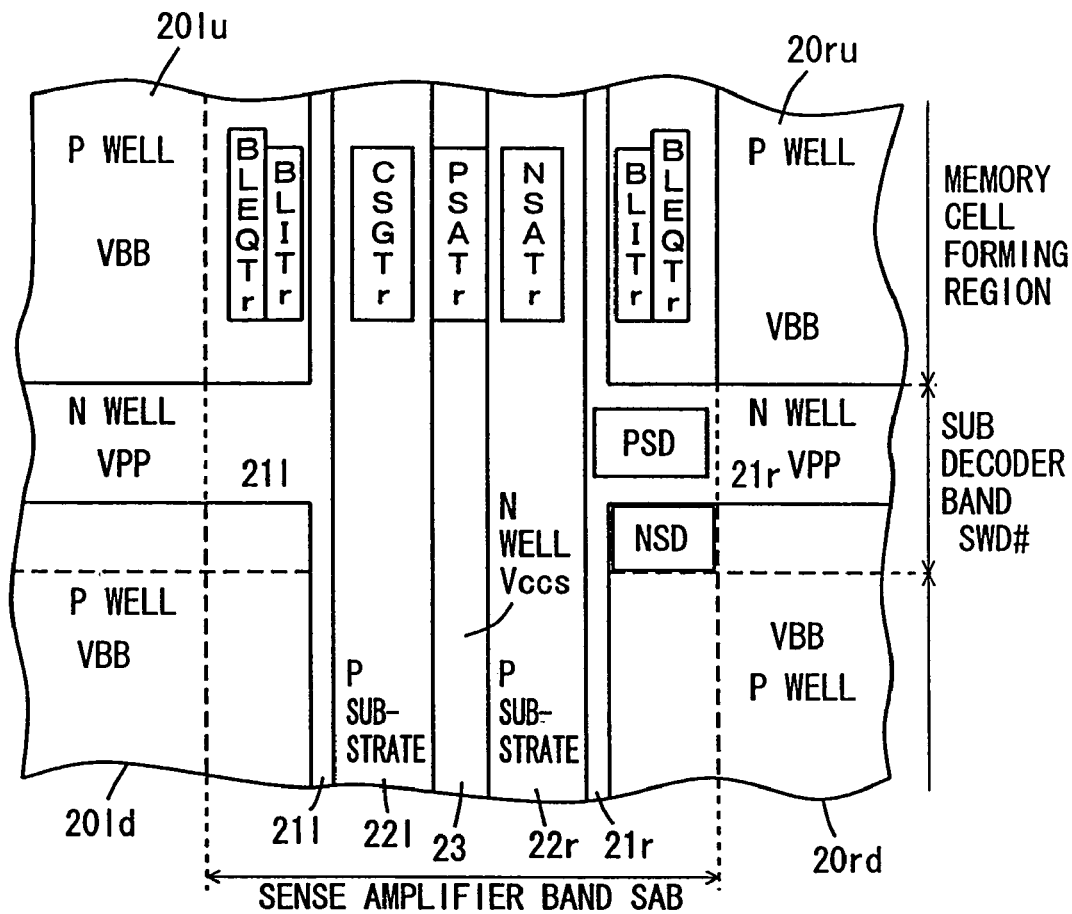
FIG. 11 is a schematic diagram of the arrangement of each transistor in the sense amplifier band shown in FIG. 10.

FIG. 11 is a schematic diagram of the arrangement of the sense amplifier drive transistors according to the third embodiment of the present invention. In FIG. 11, memory cells are formed in P wells 20lu, 20ru, 20ld and 20rd. These P wells 20lu, 20ru, 20ld and 20rd are provided with negative voltage VBB as shown in FIG. 5 according to the second embodiment. Under the lower portion of P wells aligned in the row direction, bottom N wells 21l and 21r are formed. Between memory blocks adjacent in the column direction, bottom N wells are isolated, and surfaces of P-type substrate regions 22l and 22r are exposed. An N well 23 to receive array power supply voltage Vccs is provided between P-type substrate regions 22l and 22r.

As described in the foregoing second embodiment, in sense amplifier band SAB, bit line isolation gate transistor BLITr and bit line equalize/precharge transistor BLEQTr are formed in the region of P well. On the surface of P-type substrate region 22l, a column selecting gate transistor CSGTr is formed and a P-channel MOS transistor PSATr for the sense amplifier circuit is formed in N well 23, and on the surface of P-type substrate region 22r, N-channel MOS transistor NSATr for the sense amplifier circuit is formed. These elements are the same as those according to the second embodiment.

Sense amplifier drive transistor PSD is formed on the surface of bottom N well 21r in sub decoder band SWD#. N-channel MOS transistor NSD for sense amplifier drive is formed in P well 20rd included in both sub decoder band SWD# and sense amplifier band SAB. These sense amplifier drive transistors PSD and NSD are formed of logic transistors LTR. Bottom N well 21r is provided with high voltage VPP, and P well 20rd is provided with negative voltage VBB.

Figure 12:
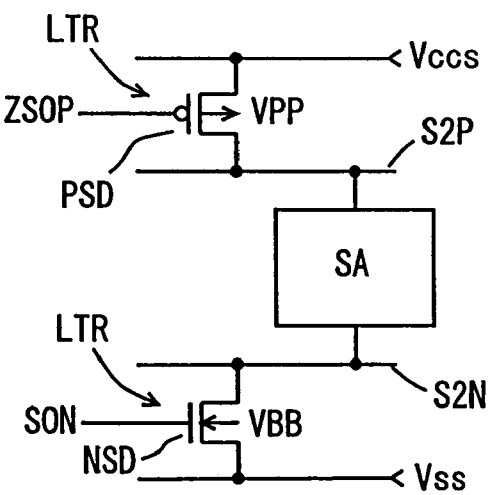
FIG. 12 is an equivalent circuit diagram of sense amplifier drive transistors in the transistor layout shown in FIG. 11.

As shown in FIG. 12, P-channel MOS transistor PSD for sense amplifier drive receives high voltage VPP at its back gate, while N-channel MOS transistor NSD for sense amplifier drive receives negative voltage VBB at its back gate. If these drive transistors are formed of logic transistors LTR, the absolute value of threshold voltage of drive transistors PSD and NSD can be set high by these back gate bias voltages VPP and VBB. As a result, when sense amplifier activation signals ZSOP and SON are in a non-active state, these drive MOS transistors PSD and NSD are in a deep off state, so that the off leakage current of these drive MOS transistors PSD and NSD can be reduced, and current consumption in a stand-by state can be reduced.

Modification

Figure 13:
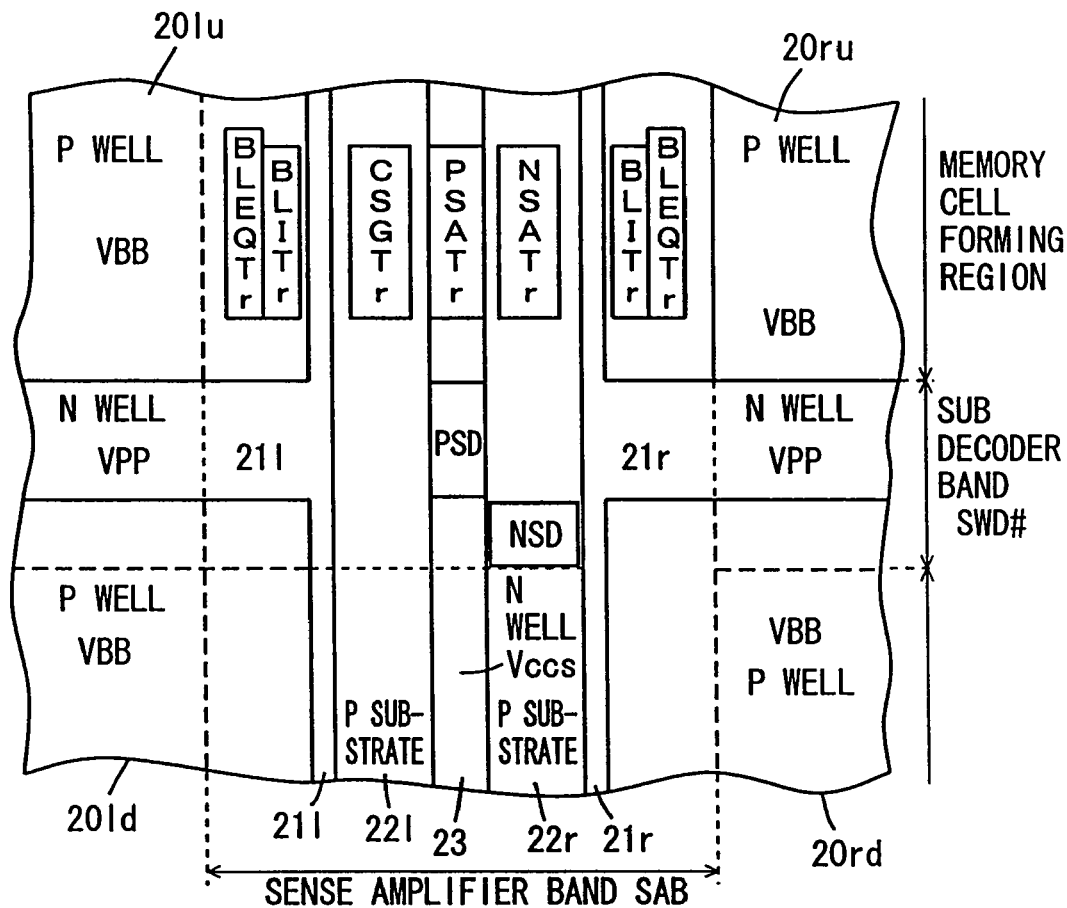
FIG. 13 is a schematic diagram of the layout of transistors according to a modification of the third embodiment.

FIG. 13 is a schematic block diagram of the configuration of a modification of a third embodiment of the present invention. In the configuration shown in FIG. 13, P-channel MOS transistor PSD for sense amplifier drive is formed in N well 23 provided extending in the column direction in sense amplifier band SAB. N-channel MOS transistor NSD for sense amplifier drive is formed on the surface of P-type substrate region having its surface region divided by N well 23. The other features are the same as those shown in FIG. 11, and corresponding portions are denoted by the same reference characters.

Figure 14:
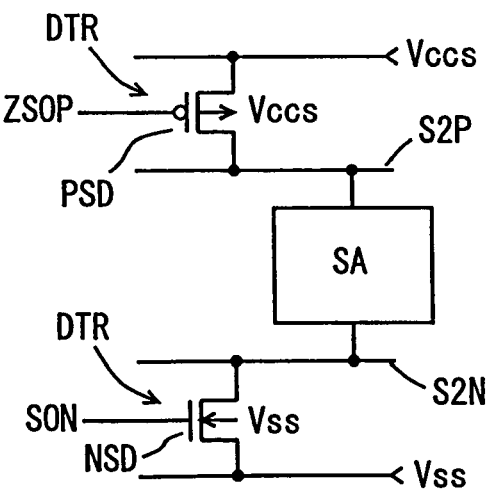
FIG. 14 is an equivalent circuit diagram of sense amplifier drive transistors in the transistor layout shown in FIG. 13.

In the configuration shown in FIG. 13, MOS transistors PSD and NSD are formed of DRAM transistors and each have a relatively large absolute value for the threshold voltage (because the gate insulating film is relatively large). Therefore, as shown in FIG. 14, array power supply voltage Vccs is applied to the back gate of P-channel MOS transistor PSD, and ground voltage Vss is applied to the back gate of N-channel MOS transistor NSD. If sense power supply voltage Vccs and ground voltage Vss are used for the back gate bias voltages of sense amplifier drive transistors, the drive transistor which is a DRAM transistor has a large absolute value for the threshold voltage, and the off leakage current of these drive MOS transistors PSD and NSD can be sufficiently restrained.

By setting the absolute value of the threshold voltage of a sense amplifier drive transistor great, the off leakage current in the part of a sense amplifier circuit can be sufficiently restrained even if a logic transistor having a small absolute value for the threshold voltage is used for the sense amplifier circuit.

A transistor in sense equalize circuit SEQ to equalize a sense amplifier drive signal line to an intermediate voltage level in a stand-by state does not cause the problem of off leakage current, and therefore may be formed of a logic transistor, or the transistor may be formed of a DRAM transistor to set the voltage level of a sense amplifier equalize control signal at a high level and implement high speed equalizing operation.

As in the foregoing, according to the third embodiment of the present invention, the drive transistor in the sense amplifier circuit is formed of a transistor provided in the crossing region of a sense amplifier band and a sub decoder band and having a large absolute value for the threshold voltage, so that off leakage current in the sense amplifier circuit portion can be surely restrained.

If a logic transistor is formed in the memory cell array region, and the off leakage current of this transistor causes a problem, the logic transistor may be provided in the well region which functions to bring the back gate of the logic transistor into a reverse bias state. As an example of such a configuration using a logic transistor, there is a differential amplifier type read column selecting gate in the separated IO configuration, in which writing data and reading data are transferred through separated data buses.

Fourth Embodiment

Figure 15:
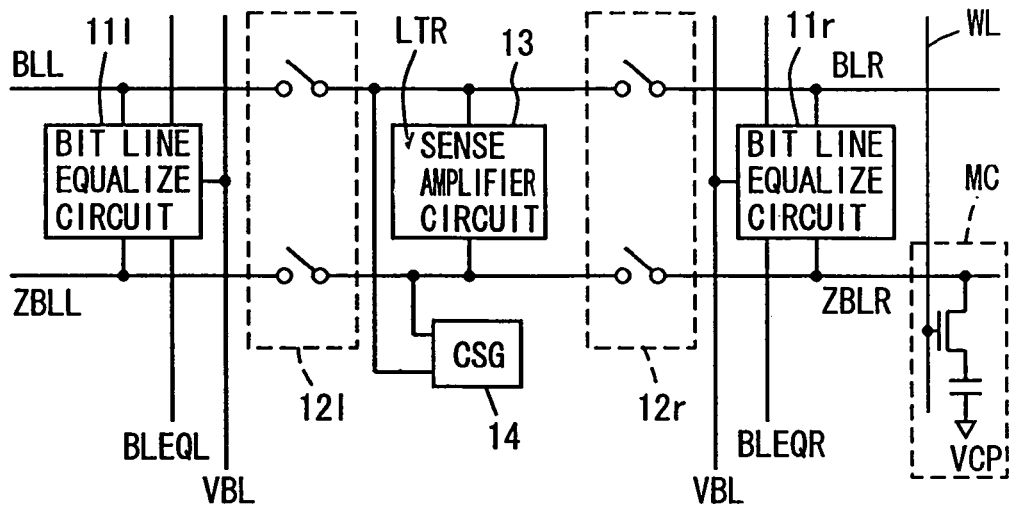
FIG. 15 is a schematic diagram of the state of a bit line isolation gate according to a fourth embodiment of the present invention.

FIG. 15 is a schematic diagram of the configuration of a sense amplifier band in a DRAM according to a fourth embodiment of the present invention. A burn-in test (acceleration test) for screening defective bits is usually performed in a DRAM circuit. In the acceleration test, a DRAM circuit is operated under high temperature and high voltage conditions to bring out potential defects. Such a burn-in test is executed to a plurality of chips at a time as a final test in a wafer level. In the burn-in test, word lines WL and bit lines BL, ZBL are provided with high voltage to bring out faults in an insulating film in a memory cell capacitor and bit line faults such as bit line contact faults in some test modes. At the time of the burn-in test, high voltage applied on bit lines BL and ZBL could destroy sense amplifier circuit 13 if sense amplifier circuit 13 is formed of a logic transistor. Therefore, as shown in FIG. 15, bit line isolation gates 12*l* and 12*r* are brought into a non-conductive state, and sense amplifier circuit 13 and column selecting gate (CSG)14 are isolated from bit lines BLL, ZBLL, BLR and ZBLR. In this state, one or both of bit line equalize circuits 11*l* and 11*r* are brought into a conductive state to raise the voltage level of bit line equalize voltage VBL. Thus, bit lines can be provided with acceleration voltage without adversely affecting sense amplifier circuit 13 and column selecting gate (CSG)14.

Figure 16:
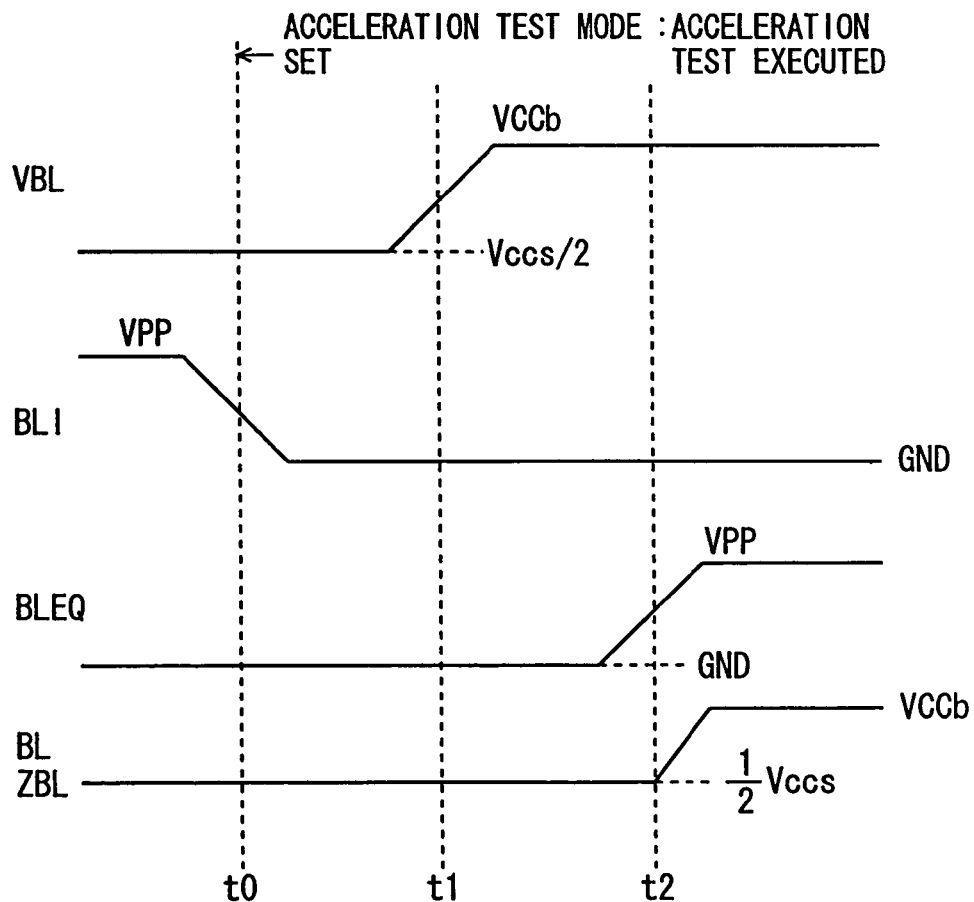
FIG. 16 is a diagram showing the waveforms of a signal and a voltage at the time of bit line voltage accelerating operation according to the fourth embodiment.

FIG. 16 is a waveform diagram for use in illustration of a burn-in test sequence according to a fourth embodiment of the present invention. As shown in FIG. 16, at time t0, bit line isolation instruction signal BLI (BLIL, BLIR) is pulled down from high voltage VPP to ground voltage GND level, to set bit line isolation gates 12*l* and 12*r* into a non-conductive state. While sense amplifier circuit 13 is isolated from bit lines BL (BLL, BLR) and ZBL (ZBLL, ZBLR), at time t1, bit line equalize voltage VBL is set to the voltage level of acceleration voltage VCCb from intermediate voltage Vccs/2.

Then, at time t2, bit line equalize instruction signal BLEQ (BLEQL, BLEQR) is raised from ground voltage GND to high voltage VPP level, to bring bit line equalize circuits 11*l* and 11*r* into a conductive state, and the voltage level of bit lines BL and ZBL is raised to the acceleration voltage VCCb level according to bit line equalize voltage VBL. The voltage level of word line WL has been raised to high voltage VPP level, and in memory cell MEMORY CELL, voltage (VCCb-VCP) is applied to the insulating film of a memory cell capacitor. Herein, VCP is cell plate voltage. Since the memory cell capacitor insulating film is continuously provided with Vccs/2, the breakdown voltage of the capacitor insulating film must be secured. By acceleration voltage applied to the memory cell capacitor insulating film, potential defects in the memory cell capacitor insulating film are brought out.

By isolating sense amplifier circuit 13 and column selecting gate (CSG) 14 from a bit line and accelerating the bit line voltage, high voltage can be prevented from being applied to sense amplifier circuit 13 and column selecting gate 14 formed of logic transistors, so that an acceleration test for the capacitor insulating film and bit line can be surely performed.

Figure 17:
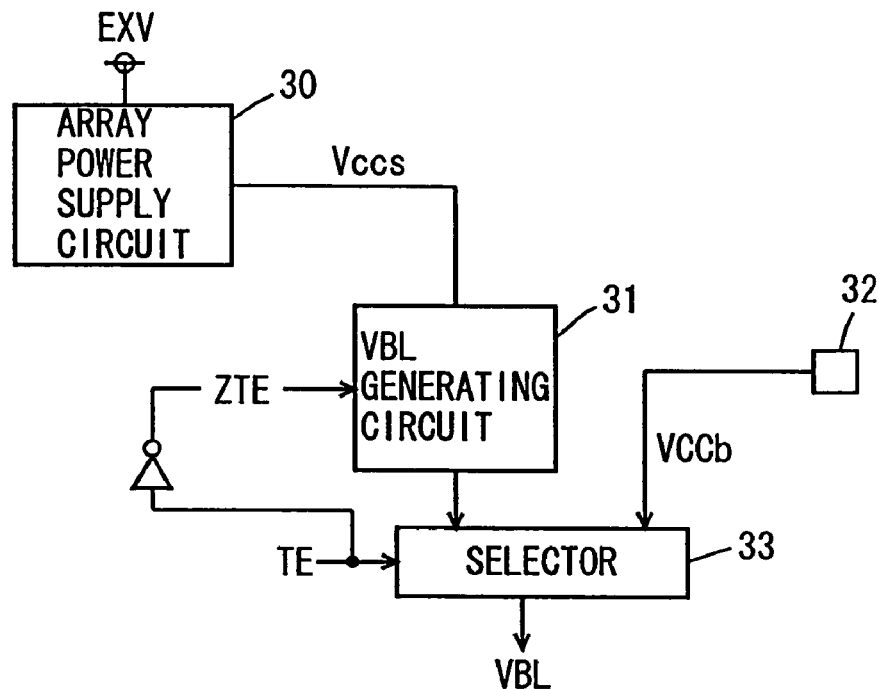
FIG. 17 is a schematic diagram of the configuration of a bit line acceleration voltage generating portion according to the fourth embodiment.

FIG. 17 is a schematic block diagram of the configuration of a part to generate bit line equalize voltage VBL according to the fourth embodiment. In FIG. 17, the intermediate voltage generating portion includes an array power supply circuit 30 to generate an array power supply voltage (sense power supply voltage ) Vccs from external power supply voltage EXV, a VBL generating circuit 31 to generate an intermediate voltage of Vccs/2 based on array power supply voltage Vccs received from array power supply circuit 30, a pad 32 to receive acceleration voltage VCCb applied from an external test device at the time of testing, and a selector 33 to select one of an output voltage from VBL generating circuit 31 and voltage Vccb from pad 32 in response to a test mode instruction signal TE, for outputting bit line equalize voltage VBL.

Array power supply circuit 30 is, for example, formed of an internal voltage down converter having a feedback loop formed of a comparator and a current drive transistor. VBL generating circuit 31 operates when a test mode instruction signal ZTE is in a non-active state (H level), and generates voltage at the intermediate voltage Vcc/2 level. When test mode instruction signal ZTE attains an active state, VBL generating circuit 31 stops its intermediate voltage generating operation. This is implemented, for example, by disconnecting a current flow path between the power supply node and ground node in VBL generating circuit 31 when test mode instruction signal ZTE is in an active state.

Selector 33 selects acceleration voltage VCCb from pad 32 when test mode instruction signal TE attains an active state, and selects the intermediate voltage from VBL generating circuit 31 when test mode instruction signal TE is in a non-active state. Test mode instruction signal TE has its H level set to a voltage level higher than acceleration voltage VCCb when activated (in order to surely perform selecting operation).

In the configuration shown in FIG. 17 when test mode instruction signal TE is in an active state, or in a test mode to apply an acceleration voltage to a bit line, the voltage level of bit line equalize voltage VBL can be set based on acceleration voltage VCCb externally applied to pad 32. Pad 32 is used because a burn-in test at a wafer level is considered as described above.

Note that when VBL generating circuit 31 is set to an output high impedance state when inactivated (for example when pull up/pull down transistors are provided at the output portion and these pull up/pull down transistors both attain an off state), selector 33 is not particularly necessary.

Figure 18:
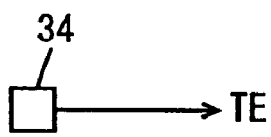
FIG. 18 is a schematic diagram of the configuration of a test mode instruction signal generating portion according to the fourth embodiment.

FIG. 18 is a schematic block diagram of the configuration of a portion to generate test mode instruction signal TE. In FIG. 18, test mode instruction signal TE is applied from an external test device through pad 34. When test mode instruction signal TE is externally directly set through pad 34, the voltage level of test mode instruction signal TE can be set based on the voltage level of acceleration voltage VCCb, and selector 33 in FIG. 17 is allowed to surely perform selecting operation. Test mode instruction signal ZTE is the inverted signal of test mode instruction signal TE. By providing a pull down resistor at pad 34, pad 34 can be fixed to the ground voltage level in an operation mode after packaging, test mode instruction signal ZTE attains an H level or inactive state, and VBL generating circuit 31 can surely generate bit line equalize voltage VBL at the level of intermediate voltage Vccs/2.

Figure 19:
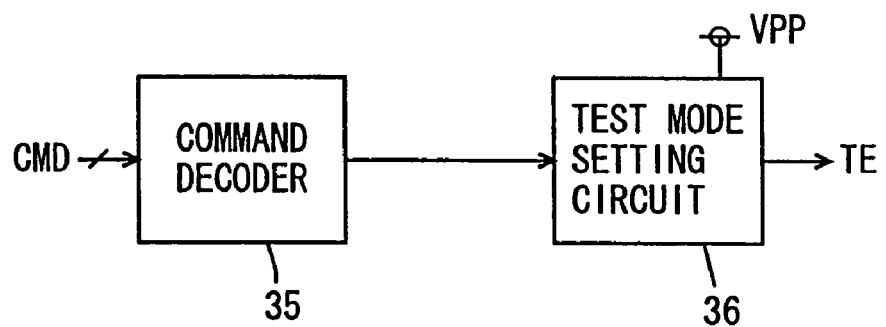
FIG. 19 is a schematic diagram of another configuration generating the test mode instruction signal according to the fourth embodiment.

FIG. 19 is a diagram of the configuration of a modification of the test mode instruction signal generating portion. In FIG. 19, the test mode instruction signal generating portion includes a command decoder 35 to decode an externally applied command CMD, and a test mode setting circuit 36 to set test mode instruction signal TE to an active state according to a test mode instruction signal from command decoder 35 and inactivate test mode instruction signal TE according to a test mode end instruction signal from command decoder 35. Test mode setting circuit 36 sets test mode instruction signal TE to high voltage VPP level when activated (considering the use of selector 33 in FIG. 17).

In FIG. 19, command CMD to instruct an operation mode is applied to command decoder 35 in the form of a combination of a plurality of control signals and address signal bits. Command CMD is directly externally applied by path-switching using a test mode setting signal in a test mode (not through a logic circuit). Test mode setting circuit 36 includes a flip-flop, for example, drives test mode instruction signal TE into an active state in response to a test mode start instruction signal, and inactivates test mode instruction signal TE in response to a test mode end instruction signal.

In this configuration, the test mode of interest can be set in the same sequence as other test modes not through a particular pad.

By the activation of this test mode instruction signal TE, bit line isolation instruction signal BLI (BLIL and BLIR) is lowered to the ground voltage level from high voltage VPP level.

Figure 20:
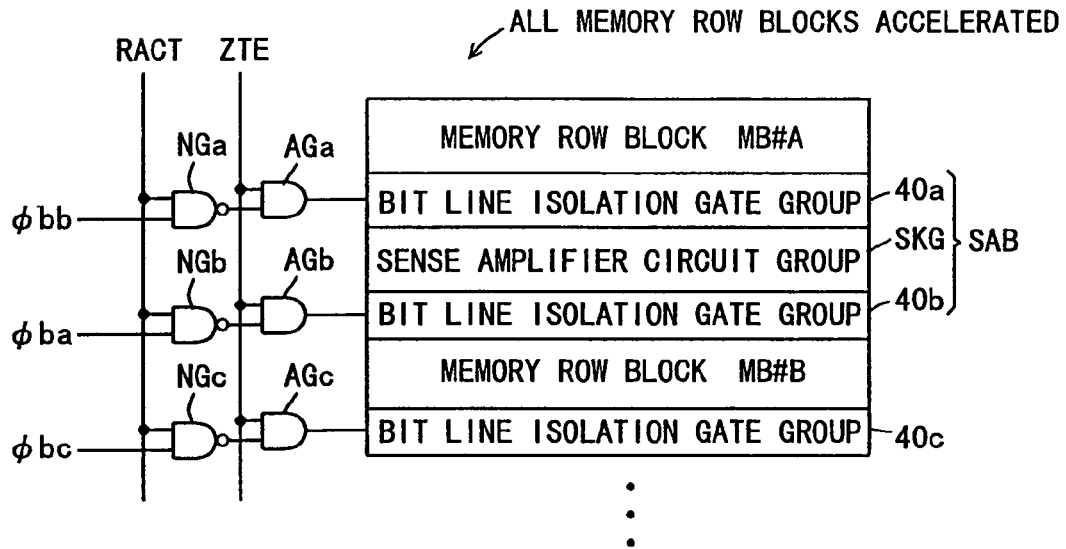
FIG. 20 is a schematic diagram of the configuration of a bit line isolation instructing signal generation portion according to the fourth embodiment.

FIG. 20 is a schematic block diagram of the configuration of the bit line isolation instruction signal generating portion.

FIG. 20 shows the configuration of a part related to sense amplifier band SAB provided between memory row blocks MB#A and MB#B. In FIG. 20, sense amplifier band SAB includes a bit line isolation gate group 40a for isolating sense amplifier circuit group SKG and memory row block MB#A, and a bit line isolation gate group 40b for isolating sense amplifier circuit group SKG from memory row block MB#B. Memory row block BM#B is further provided with a bit line isolation gate group 40c, and shares a sense amplifier circuit group (not shown) with memory row block MB#C which is not shown. Bit line isolation gate group 40c attains a non-conductive state when memory row block MB#C, which is not shown, is in a selected state (when a word line is selected).

Bit line isolation gate group 40a is provided with a NAND circuit NGa to receive a memory block designation signal φbb for designating memory row block MB#B and an array activation signal RACT to activate a row selecting operation and an AND circuit AGa to receive the output signal of NAND circuit NGa and test mode instruction signal ZTE. Test mode instruction signal ZTE is set to an active state at L level in a bit line acceleration voltage application mode.

Bit line isolation gate group 40b is provided with a NAND circuit NGb to receive a block designation signal φba for designating memory row block MB#A and an array activation instruction signal RACT, and an AND circuit AGb to receive the output signal of NAND circuit NGb and test mode instruction signal ZTE.

Bit line isolation gate group 40c is provided with a NAND gate NGc to receive array activation instruction signal RACT and block designation signal φbc for designating memory row block MB#C which is not shown, and an AND circuit AGc to receive the output signal of NAND circuit NGc and test mode instruction signal ZTE. Bit line isolation instruction signals for corresponding bit line isolation gate groups are formed from AND circuits AGa to AGc.

In an operation mode other than the bit line acceleration voltage application mode, test mode instruction signal ZTE is at an inactive H level, and AND circuits AGa to AGc operate as a buffer circuit.

In a stand-by cycle, array activation instruction signal RACT is at an L level, an output signal from NAND circuits NGa to NGc attains an H level, and bit line isolation instruction signals corresponding to bit line isolation gate groups 40a to 40c attain an H level accordingly, and these bit line isolation gate groups 40a to 40c are set to a conductive state.

When array activation instruction signal RACT attains a H level active state, NAND circuits NGa to NGc operate as an inverter circuit. When memory row block MB#A is designated, block designation signal φba attains an H level, the output signal of NAND circuit NGb attains an L level accordingly, bit line isolation gate group 40b attains a non-conductive state, and sense amplifier circuit group SKG and memory block MB#B are isolated. Block designation signals φbb and φbc are in a non-selected state at L level, the output signals of NAND circuits NGa and NGc maintain their H levels accordingly, and bit line isolation gate groups 40a and 40c maintain their conductive states.

When memory row blocks MB#A and MB#B are both in a non-selected state, block designation signals φbb and φba are both at an L level of non-selected state, the bit line isolation instruction signals from AND circuits AGa and AGb maintain their H levels and bit line isolation gate groups 40a and 40b maintain their conductive states.

Therefore, using the configuration shown in FIG. 20, in the bit line acceleration voltage application mode, test mode instruction signal ZTE allows all the bit line isolation gate groups 40a to 40c to attain a non-conductive state, and sense amplifier circuit group SKG can be isolated from each corresponding memory row block. In a bit line acceleration voltage application mode thereafter, a general row selecting operation is performed and a voltage is applied to each bit line, which will be described later.

Note that array activation instruction signal RACT is driven to and maintained in an active state when command decoder 35 is provided with a row access command and an operation mode to select a row of memory cells is designated. This array activation instruction signal RACT maintains an active state until a precharge command instructing the end of a row accessing is applied.

Figure 21:
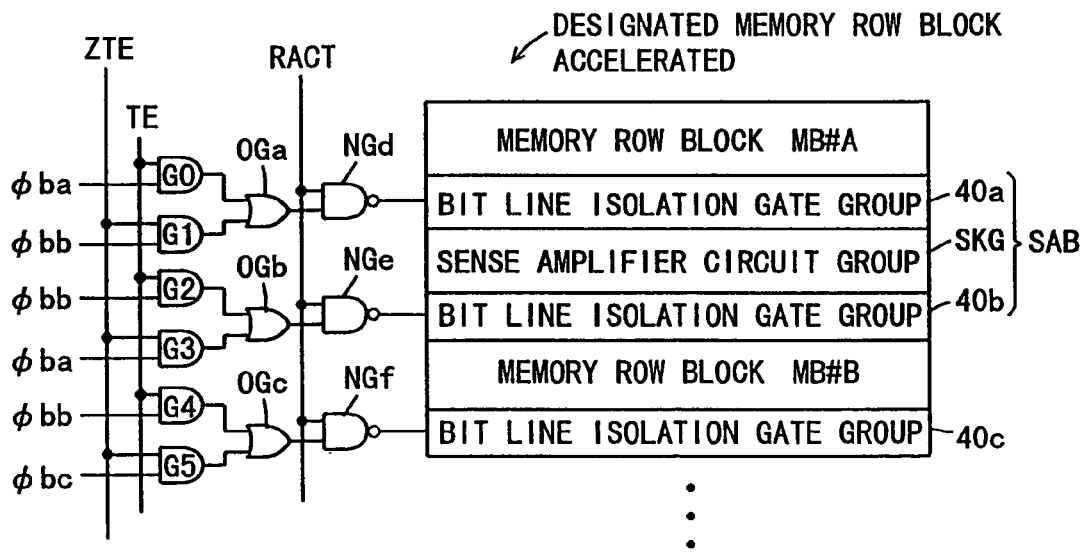
FIG. 21 is a schematic diagram of another configuration of the bit line isolation instruction signal generating portion according to the fourth embodiment.

FIG. 21 is a diagram of a modification of the bit line isolation instruction signal generating portion. In FIG. 21, bit line isolation gate group 40a is provided with an AND circuit G0 to receive test mode instruction signal TE and block designation signal aba, an AND circuit G1 to receive a complementary test mode instruction signal ZTE and memory block designation signal φbb, an OR circuit OGa to receive the output signals of AND circuits G0 and G1, and a NAND circuit NGd to receive the output signal of OR circuit OGa and array activation instruction signal RACT. Memory block designation signals φba and φbb designate memory row blocks MB#A and MB#B, respectively.

Bit line isolation gate group 40b is provided with an AND circuit G2 to receive test mode instruction signal TE and memory block designation signal φbb, an AND circuit G3 to receive test mode instruction signal ZTE and memory block designation signal φba, an OR circuit OGb to receive the output signals of AND circuits G2 and G3, and a NAND circuit NGe to receive the output signal of OR circuit OGb and array activation instruction signal RACT.

Bit line isolation gate group 40c is provided with an AND circuit G4 to receive test mode instruction signal TE and memory block designation signal φbb, an AND circuit G5 to receive test mode instruction signal ZTE and memory block designation signal φbc, an OR circuit OGc to receive the output signals of AND circuits G4 and G5, and a NAND circuit NGf to receive the output signal of OR circuit OGc and array activation instruction signal RACT. Memory block designation signal φbc designates memory row block MB#C which is not shown. Memory row block MB#C shares a sense amplifier circuit with memory row block MB#B.

In the bit line acceleration voltage application mode, test mode instruction signal TE attains an H level, and complementary test mode instruction signal ZTE attains an L level. In this state, AND circuits G1, G3 and G5 have their output signals fixed to an L level. Meanwhile, AND circuits G0, G2 and G4 operate as a buffer. When memory row block MB#B is designated, memory block designation signal φbb attains an H level. At this time, the output signals of AND circuits G2 and G4 attain an H level and the output signals of OR circuits OGb and OGc attain an H level accordingly.

When array activation instruction signal RACT is raised to an H level, the output signals of NAND circuits NGe and NGf attain an L level, bit line isolation gate groups 40b and 40c attain a non-conductive state, and memory row block MB#B is disconnected from sense amplifier circuit group SKG. Meanwhile, NAND circuit NGd outputs an H level signal as the output signal of OR circuit OGa is at an L level, bit line isolation gate 40a is in a conductive state, and sense amplifier circuit group SKG is connected to memory row block MB#A. As a result, if a bit line acceleration voltage is applied through a bit line equalize circuit in memory row block MB#B, the bit line acceleration voltage is not transmitted to sense amplifier circuits in sense amplifier circuit group SKG formed of logic transistors, so that the sense amplifier circuits and column selecting gates can be prevented from being destroyed.

Figure 22:
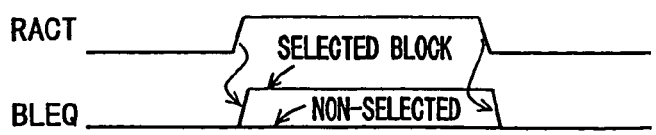
FIG. 22 is a signal waveform diagram showing the manner how a bit line equalize instruction signal is generated in the operation of the bit line isolation instruction signal generating portion shown in FIG. 21.
Figure 26:
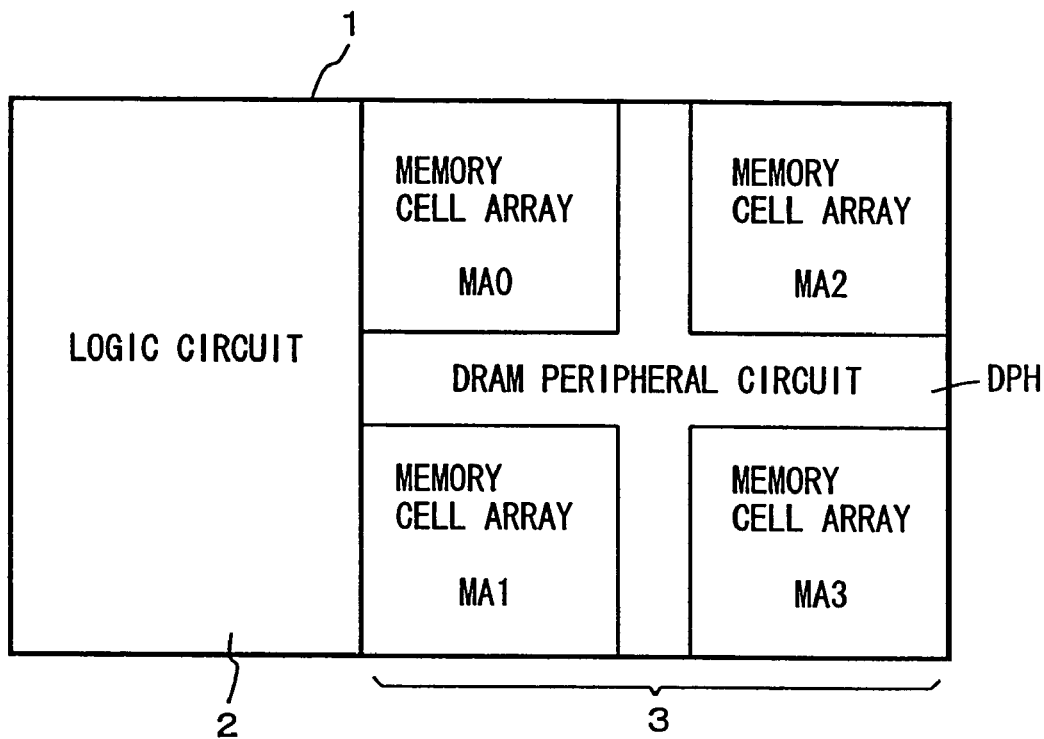
FIG. 26 is a schematic diagram of the general configuration of a conventional semiconductor integrated circuit device.
Figure 27A:
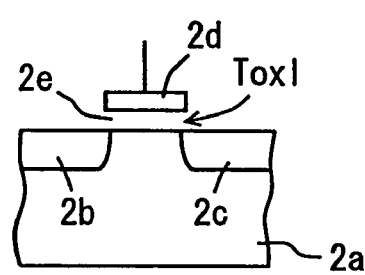
FIG. 27A is a schematic cross sectional view of a logic transistor.
Figure 27B:
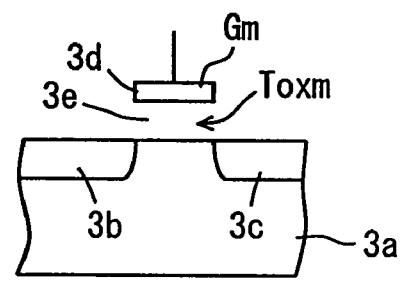
FIG. 27B is a schematic cross sectional view of a DRAM transistor.

In this state, memory row block MB#A is connected to sense amplifier circuit group SKG through bit line isolation gate group 40a, and at this time, the bit line equalize circuit is maintained in an inactive state in memory row bock MB#A. Only in the selected memory row block MB#B, the bit line equalize circuit is once again activated in response to array activation instruction signal RACT (see FIG. 22). Thus, if externally applied acceleration voltage Vccb is supplied in common to all the bit line equalize circuits in the memory cell array, the bit lines (capacitor insulating films) can be accelerated on a memory row block basis.

In the configurations as shown in FIGS. 20 and 21, a plurality of word lines in one memory row block can be driven into a selected state at a time. This test mode is employed simply to accelerate voltage stress upon the capacitor insulating films by applying high voltage to the bit lines, and data does not have to be written/read. When a defective bit is detected after the acceleration test, data is written/read according to a normal operation mode.

In the normal operation mode other than the bit line acceleration voltage application mode, test mode instruction signal TE attains an L level, complementary test mode instruction signal ZTE attains an H level, and AND circuits G0, G2 and G4 are brought into a disabled state and their output signals are fixed to the L level. Meanwhile, AND circuits G1, G3 and G5 are enabled, and when a memory row block on one of sharing memory row blocks is selected, the bit line isolation gate group of the other non-selected memory row block of the pair is set to a non-conductive state.

When, for example, memory row block MB#B is selected, AND circuit G1 outputs an H level signal, and the output signal of OR circuit OGa attains an H level accordingly. In response to the activation of array activation instruction signal RACT, the output signal of NAND circuit NGd falls to an L level. (Array activation instruction signal RACT in an active state is at an H level.) Meanwhile, the output signals of NAND circuits NGe and NGf attain an H level because the output signals of corresponding OR circuit OGb and OGc are at an L level, bit line isolation gate groups 40b and 40c maintain their conductive states, and memory row block MB#B is connected to sense amplifier circuit groups SKG provided on both sides thereof. Thus, in the shared sense amplifier configuration, data on a bit line pair can be accurately sensed and amplified.

FIG. 23A is a schematic diagram of the configuration of a bit line equalize instruction signal generating portion. In FIG. 23A, the bit line equalize instruction signal generating portion includes a NAND circuit 40 to receive array activation instruction signal RACT and memory block designation signal φbi, and an OR circuit 41 to receive an output signal from NAND circuit 40 and test mode instruction signal TE and generate a bit line equalize instruction signal BLEQi. OR circuit 41 is individually provided for each of memory row blocks and controls the operation of a bit line equalize circuit included in memory row block MB#i designated by memory block designation signal φbi, where i is any.

The H level of bit line equalize instruction signal BLEQi is the level of high voltage VPP level, and therefore operation power supply voltage of OR circuit 41 is at the level of high voltage VPP. Array activation instruction signal RACT and memory block designation signal φbi may be at the peripheral power supply voltage level of a DRAM array. OR circuit 41 has only to include a level conversion function. The operation of the bit line equalize instruction signal generating portion shown in FIG. 23A will be now described in conjunction with a signal waveform diagram of FIG. 23B.

In the bit line voltage acceleration mode, test mode instruction signal TE attains an H level or active state, and bit line equalize instruction signal BLEQi at an H level (high voltage VPP level) is generated by OR circuit 41 regardless of the logical level of the output signal of AND circuit 40. Therefore, in this state, in all the memory blocks, bit line equalize instruction signal BLEQi attains an H level, and acceleration voltage Vccb is transmitted to each bit line for performing an acceleration test.

When the bit line acceleration voltage application test is completed, test mode instruction signal TE attains an L level, and OR circuit 41 operates as a buffer circuit. In this state, according to array activation instruction signal RACT and memory block designation signal φbi, bit line equalize instruction signal BLEQi is generated. When memory block designation signal φbi is in an L level, bit line equalize instruction signal BLEQi maintains its H level, and bit lines in a non-selected memory row block are precharged and equalized to intermediate voltage VBL by the equalize circuit. When memory block designation signal φbi is in an H level of selected state, the output signal of NAND circuit 40 attains an L level, bit line equalize instruction signal BLEQi attains an L level accordingly, and the equalize/precharge operation by the bit line equalize circuit in the selected memory row block is stopped.

FIG. 24 is a schematic block diagram of the configuration of a part to generate array activation instruction signal RACT. In FIG. 24, the array activation instruction signal generating portion includes a command decoder 42 to decode an externally applied command CMD and a row access instruction detection circuit 43 to detect an instruction of row access based on a row access instruction signal from command decoder 42, for driving array activation instruction signal RACT into an active state. This array activation instruction signal RACT activates row-related circuits, and a row selecting operation is performed.

Memory block designation signal φbi is generated based on a block-specifying address included in a row address signal. Therefore, after array activation instruction signal RACT attains an active state, the logical level of memory block designation signal φbi is made definite, and the state of bit line equalize instruction signal BLEQi can be set at an early timing after decision of the state of the memory block designation signal.

The bit line equalize instruction signal generating portion shown in FIG. 23A is used in combination with the bit line isolation instruction signal generating portion shown in FIG. 20. Thus, acceleration voltage can be transmitted to bit lines in all the memory blocks.

Modification of Bit Line Equalize Instruction Signal Generating Portion

FIG. 25A is a schematic block diagram of a modification of a bit line equalize instruction signal generating portion. In FIG. 25A, the bit line equalize instruction signal generating portion includes a NAND circuit 45 to receive memory block designation signal φbi and array activation instruction signal RACT, an inverter 46 to invert the output signal of NAND circuit 45, a CMOS transmission gate 47 to pass the output signal of inverter 46 according to test mode instruction signals TE and ZTE, and a CMOS transmission gate 48 to conduct complementarily with CMOS transmission gate 47 in response to test mode instruction signals TE and ZTE for passing the output signal of NAND circuit 45.

The output nodes of CMOS transmission gates 47 and 48 are connected in common to generate bit line equalize instruction signal BLEQi to memory row block MB#i. CMOS transmission gate 47 conducts during an activation of test mode instruction signal TE, and CMOS transmission gate 48 conducts during an inactivation of test mode instruction signal TE. The operation of the bit line equalize instruction signal generating portion shown in FIG. 25A will be now described in conjunction with the signal waveform diagram in FIG. 25B.

When test mode instruction signal TE is activated, CMOS transmission gate 47 selects the output signal of inverter 46 and generates bit line equalize instruction signal BLEQi. When array activation instruction signal RACT is at an L level, the output signal of NAND circuit 45 is at an H level, and therefore bit line equalize instruction signal BLEQi is at an L level. As a result, if bit line equalize voltage VBL is raised according to accelerated Vccb during an activation of test mode instruction signal TE, the voltage is not transmitted to bit lines.

In the test mode, a memory block is designated by memory block designation signal φbi, and array activation instruction signal RACT is driven into an active state. When memory block designation signal φbi attains an active state at H level, the output signal of NAND circuit 45 attains an L level, and bit line equalize instruction signal BLEQi attains an H level accordingly. Meanwhile, when memory block designation signal φbi is in an L-level or inactive state, similarly to the stand-by state, bit line equalize instruction signal BLEQi maintains an L level. More specifically, in the test mode, a bit line equalize circuit in a selected memory block operates and transmits acceleration voltage Vccb onto a bit line. In a non-selected memory block, the bit line equalize circuit is in an non-operative state, and the bit lines are in a floating state.

When the acceleration test is completed, test mode instruction signal TE is inactivated, CMOS transmission gate 47 attains a non-conductive state, and CMOS transmission gate 48 attains a conductive state. When array activation instruction signal RACT is at an L level, bit line equalize instruction signal BLEQi attains an H level according to the output signal of NAND circuit 45. Thus, a bit line in each memory block is precharged and equalized to a prescribed intermediate voltage VBL level by the bit line equalize circuit and equalized.

When array activation instruction signal RACT attains an H level and memory block instruction signal φbi is at an H level, the output signal of NAND circuit 45 attains an L level, bit line equalize instruction signal BLEQi attains an L level accordingly, so that the bit line equalize circuit is brought into a non-operative state. Meanwhile, when memory block designation signal φbi is at an L level, the output signal of NAND circuit 45 is at an H level, bit line equalize instruction signal BLEQi maintains an H level, and a bit line is precharged/equalized by the bit line equalize circuit in a non-selected memory block similarly to the case in the stand-by cycle.

In the test mode, high voltage is simply applied to a memory capacitor through a bit line to accelerate voltage stress for a capacitor insulating film and the bit line, sensing operation on a bit line potential is not performed, and therefore there will be no problem even if a bit line is held in the floating state in each non-selected memory block.

The configuration to apply bit line acceleration voltage only to a designated memory block shown in FIG. 25A is used in combination with the configuration shown in FIG. 21.

In the signal waveforms in FIGS. 23B and 25B, in the test operation mode, acceleration voltage continues to be applied to a bit line. However, in this bit line voltage accelerating operation mode, bit line equalize instruction signal BLEQi may be toggled. By using an ANDed version of test mode instruction signal TE and array activation instruction signal RACT as a test mode instruction signal, the toggle operation of the bit line acceleration voltage according to array activation instruction signal RACT can be implemented, so that dynamic stress acceleration can be achieved.

As in the foregoing, according to the fourth embodiment of the present invention, in the bit line voltage accelerating operation mode, the acceleration voltage is applied to each bit line from the bit line equalize circuit while isolating the sense amplifier circuit and the bit line by the bit line isolation gate, the bit line voltage can be surely accelerated even if a logic transistor is used for the sense amplifier circuit.

Note that the bit line voltage acceleration can be employed in combination with operation such as the voltage acceleration of a word line.

Other Applications

In the foregoing, in a DRAM circuit, a transistor formed in the same manufacturing process as a transistor in a logic circuit formed on the same chip are selectively used. However, the invention can be applied to the configuration of a single DRAM in which the thickness of the gate insulating film of a MOS transistor which is a component of a peripheral control circuit is made smaller than that of the gate insulating film of a MOS transistor in a memory array portion and an internal voltage generating circuit.

As described above, according to the present invention, the MOS transistor which is a component of the DRAM circuit is formed in the manufacturing process the same as that of the transistor which is a component of the logic circuit, the manufacturing process can be simplified, and a DRAM circuit operating at a high speed can be implemented without loss in reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:
a logic circuit including a logic transistor formed of an insulted gate type field effect transistor as a component thereof and executing a prescribed processing; and
memory circuitry for storing at least data to be used by said logic circuit, said memory circuitry including a first circuit configured for receiving first and second voltages a difference of which provides a first amplitude and a second circuit configured for receiving third and fourth voltages a difference of which provides a second amplitude, the second amplitude being greater than the first amplitude,
said first circuit including as a component thereof a first-type insulated gate field effect transistor having a first gate insulting film of a single-gate structure different from a stacked gate structure having two electrodes stacked with an insulating film placed in between, said second circuit including as a component thereof a second-type insulated gate field effect transistor having a second gate insulating film of the single-gate structure, the second gate insulating film being thicker than the first gate insulating film, said logic transistor having a gate insulating film with a thickness of the first gate insulating film.

2. The semiconductor integrated circuit device according to claim 1, wherein
said memory circuitry further includes:
a memory cell array having a plurality of memory cells arranged in rows and columns, the memory cell including said second-type insulated gate field effect transistor as a component thereof.

3. The semiconductor integrated circuit device according to claim 2, wherein
said memory circuitry further includes:
a plurality of sense amplifier circuits provided corresponding to the columns of the memory cells, each for sensing and amplifying data of a memory cell on a corresponding column,
the sense amplifier circuit including said first-type insulated gate field effect transistor as a component thereof.

4. The semiconductor integrated circuit device according to claim 3, wherein
said memory circuitry further includes:
a sense power supply line; and
a plurality of sense amplifier drive transistors each provided for a predetermined number of the sense amplifier circuits and being formed of the second-type insulated gate field effect transistor, for coupling, when made conductive, corresponding sense amplifier circuits to said sense power supply line.

5. The semiconductor integrated circuit device according to claim 4, wherein:
said memory cell array is divided into a plurality of memory blocks along directions of the rows and the columns;
the sense amplifier circuit is provided in a region between memory blocks adjacent in the direction of the columns; and
the sense amplifier drive transistor is provided in a crossing region of a region for arranging the sense amplifier circuit and a region between memory blocks adjacent in the direction of the rows.

6. The semiconductor integrated device according to claim 3, wherein
said memory circuitry further includes:
a sense power supply line; and
a plurality of sense amplifier drive transistors each provided for a predetermined number of the sense amplifier circuits and being formed of the first-type insulated gate transistor, for coupling the sense power supply line to the sense amplifier circuits, back gates of said plurality of sense amplifier drive transistors receiving a voltage larger in absolute value than a voltage on said sense power supply line.

7. The semiconductor integrated circuit device according to claim 6, wherein:
said memory cell array is divided into a plurality of memory blocks along directions of the rows and columns; and
the sense amplifier drive transistor is provided in a region between memory blocks adjacent in the directions of the rows.

* * * * *